(12) United States Patent
Nagaoka et al.

(10) Patent No.: US 6,333,877 B1
(45) Date of Patent: Dec. 25, 2001

(54) STATIC TYPE SEMICONDUCTOR MEMORY DEVICE THAT CAN SUPPRESS STANDBY CURRENT

(75) Inventors: Hideaki Nagaoka; Kiyoyasu Akai, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/606,316

(22) Filed: Jun. 29, 2000

(30) Foreign Application Priority Data

Jan. 13, 2000 (JP) ................................................ 12-004492

(51) Int. Cl.$^7$ ..................................................... G11C 7/00
(52) U.S. Cl. ...................... 365/200; 365/154; 365/225.7; 365/226
(58) Field of Search .................................. 365/200, 154, 365/226, 129, 189.01, 225.7

(56) References Cited

U.S. PATENT DOCUMENTS

| | | | |
|---|---|---|---|
| 5,579,266 | 11/1996 | Tahara | 365/200 |
| 5,687,178 | 11/1997 | Herr | 714/721 |
| 5,706,231 | 1/1998 | Kokubo | 365/200 |
| 6,018,488 * | 1/2000 | Mishima et al. | 365/225.7 |

FOREIGN PATENT DOCUMENTS 3-212899  9/1991  (JP).
5-314790 * 5/1992  (JP).

* cited by examiner

Primary Examiner—Hoai V. Ho
(74) Attorney, Agent, or Firm—McDermott, Will & Emery

(57) ABSTRACT

A memory cell power supply line is provided to supply a ground potential corresponding to each column in a regular memory cell array. Among fuse elements, the fuse element corresponding to the memory cell column that is to be subjected to redundancy replacement is decoupled, whereby supply of the ground potential to the regular memory cell column to be replaced is suppressed.

14 Claims, 35 Drawing Sheets

STATIC TYPE SEMICONDUCTOR MEMORY DEVICE THAT CAN SUPPRESS STANDBY CURRENT

BACKGROUND OF THE INVENTION

1. Field of the Invention

The present invention relates to static type semiconductor memory devices, and particularly to a static type semiconductor memory device with a spare column or spare row for replacing a defective memory cell row or defective memory cell column.

2. Description of the Background Art

FIG. 39 is a circuit diagram showing a structure of a memory cell of a static type random access memory (referred to as SRAM hereinafter) formed of conventional MOS transistors.

Referring to FIG. 39, a conventional memory cell includes a P channel MOS load transistor P11 and an N channel MOS driver transistor N11 connected in series between a power supply potential Vcc and a ground potential GND, and a P channel MOS load transistor P12 and an N channel MOS driver transistor N12 connected in series between power supply potential Vcc and ground potential GND. The connection node of P channel MOS load transistor P11 and N channel MOS driver transistor N11 is referred to as a storage node nm1. The connection node between P channel MOS load transistor P12 and N channel MOS driver transistor N12 is referred to as a storage node nm2.

Transistors P11 and N11 have their gates connected to storage node nm2. Transistors P12 and N12 have their gates connected to storage node nm1.

The conventional memory cell further includes an N channel MOS access transistor Tra1 provided between a bit line BL and storage node nm1, and having a gate potential controlled by a word line WL, and an N channel MOS access transistor Tra2 provided between storage node nm2 and a bit line /BL, and having a gate potential controlled by word line WL.

FIG. 40 is a diagram showing a concept of short-circuit between storage nodes of SRAM memory cells. As shown in FIG. 40, there is a case where short-circuit occurs between two storage nodes in an SRAM caused by foreign objects in the wiring or contact formation processes or by defocus in photolithography.

Such a chip that has bit error is generally subjected to a replacement process with a redundant column or row in order to be shipped as an acceptable product.

Even if this chip is passed as a product acceptable from the standpoint of memory operation by the redundancy replacement, short-circuit of the storage nodes in the case of a full CMOS SRAM cell implies that there is still a path through which a current flows from power supply potential Vcc to ground potential GND as shown in FIG. 40.

The existence of a current path in a defective memory cell becomes the cause of standby current defect in an SRAM of low power consumption. There was a problem that such a chip could not be shipped eventually as an acceptable product even if redundancy replacement is carried out.

SUMMARY OF THE INVENTION

An object of the present invention is to provide a static type semiconductor memory device of favorable yield and having a standby current that becomes lower than the specification value.

According to an aspect of the present invention, a static type semiconductor memory device includes a regular memory cell array, a redundant memory cell array, a first power supply node, a plurality of first lines, and a potential supply control circuit.

The regular memory cell array has a plurality of memory cells arranged in a matrix. Each memory cell can retain a first level and a second level. The regular memory cell array is divided into a plurality of units of memory cell replacement.

The redundant memory cell array carries out redundancy repair for every memory cell replacement unit in the regular memory cell array.

The first power supply node is supplied with a first potential corresponding to the first level.

The plurality of first lines are provided corresponding to every memory cell replacement unit to supply the first potential from the power supply node to a memory cell in a corresponding memory cell replacement unit.

The potential supply control circuit can stop independently the supply of the first potential from the power supply node to the plurality of first lines.

According to another aspect of the present invention, a static type semiconductor memory device includes a regular memory cell array, a redundant memory cell array, a plurality of first lines, and a plurality of potential retain circuits.

The regular memory cell array has a plurality of memory cells arranged in a matrix. Each memory cell can retain a first level and a second level. The regular memory cell array is divided into a plurality of units of memory cell replacement.

The redundant memory cell array carries out redundancy repair for every unit of memory cell replacement in the regular memory cell array.

The plurality of first lines are provided corresponding to every memory cell replacement unit to supply the first potential from the power supply node to a memory cell in a corresponding memory cell replacement unit in a normal operation.

The plurality of potential retain circuits are provided corresponding to the plurality of first lines, respectively, to precharge the potential of a corresponding first line to a second potential corresponding to the second level after initiation of power supply to the static type semiconductor memory device, and supplying the first potential to a corresponding first line in response to a corresponding memory cell placement unit being accessed.

A main advantage of the present invention is that leakage current in a standby status can be suppressed since supply of the first potential to the first line is stopped when redundancy replacement is performed.

Another advantage of the present invention is that leakage current can be suppressed in a standby status since supply of the first potential to the first line is stopped in the memory cell placement unit that is to be subjected to redundancy replacement.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
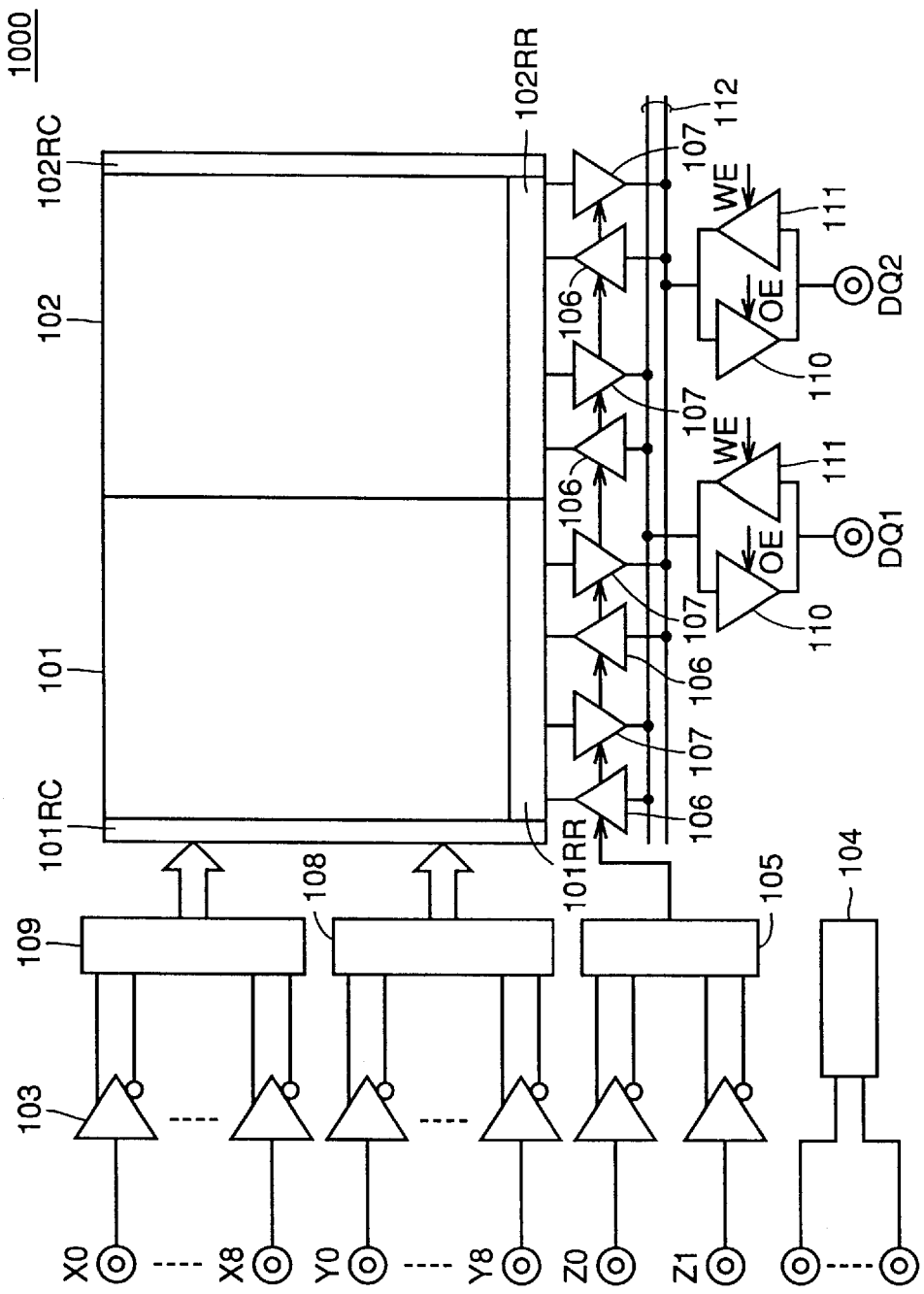
FIG. 1 is a schematic block diagram to describe a structure of a static type semiconductor memory device 1000 according to a first embodiment of the present invention.

FIG. 1 is a schematic block diagram to describe a structure of a static type semiconductor memory device 1000 according to a first embodiment of the present invention.

For the sake of simplification, an SRAM of a two-word structure, i.e., an SRAM having a structure with data I/O of two systems where data input/output is effected through two data input/output terminals DQ1 and DQ2, is shown in FIG. 1.

Referring to FIG. 1, SRAM 1000 includes memory blocks 101–102, an address buffer 103 receiving an external address signal to output a complementary internal address signal, a control circuit 104 to control the operation of SRAM 1000 according to an externally applied control signal, a block selector circuit 105 selecting a memory block to be accessed according to address signals Z0–Z1, a row decoder 109 to select a memory cell row (word line) to be accessed according to address signals X0–X8 in the selected memory block, a column decoder 108 to select a memory cell column (bit line pair) to be accessed according to address signals Y0–Y8 in the selected memory block, a write driver 106 to write data into the selected memory cell, a sense amplifier 107 for data read out, a data output buffer 110 to provide the read out data to data input/output terminal DQ1 or DQ2, a data input buffer 111 to input write data applied to data input/output terminal DQ1 or DQ2, and a data bus 112 to transfer data between data output buffer 110 and sense amplifier 107 or between data input buffer 111 and write driver 106. Data input buffer 111 includes an input protection circuit to convert the level of an externally applied input signal to an internal logic level.

A redundant memory cell row 101RR and a redundant memory cell column 101RC are provided corresponding to memory block 101 to carry out repair by redundancy replacement when there is a defect in the memory cell in memory block 101.

Similarly, a redundant memory cell row 102RR and a redundant memory cell column 102RC are provided corresponding to memory block 102 to carry out repair by redundancy replacement when there is a defect in a memory cell in memory block 102.

Figure 2:
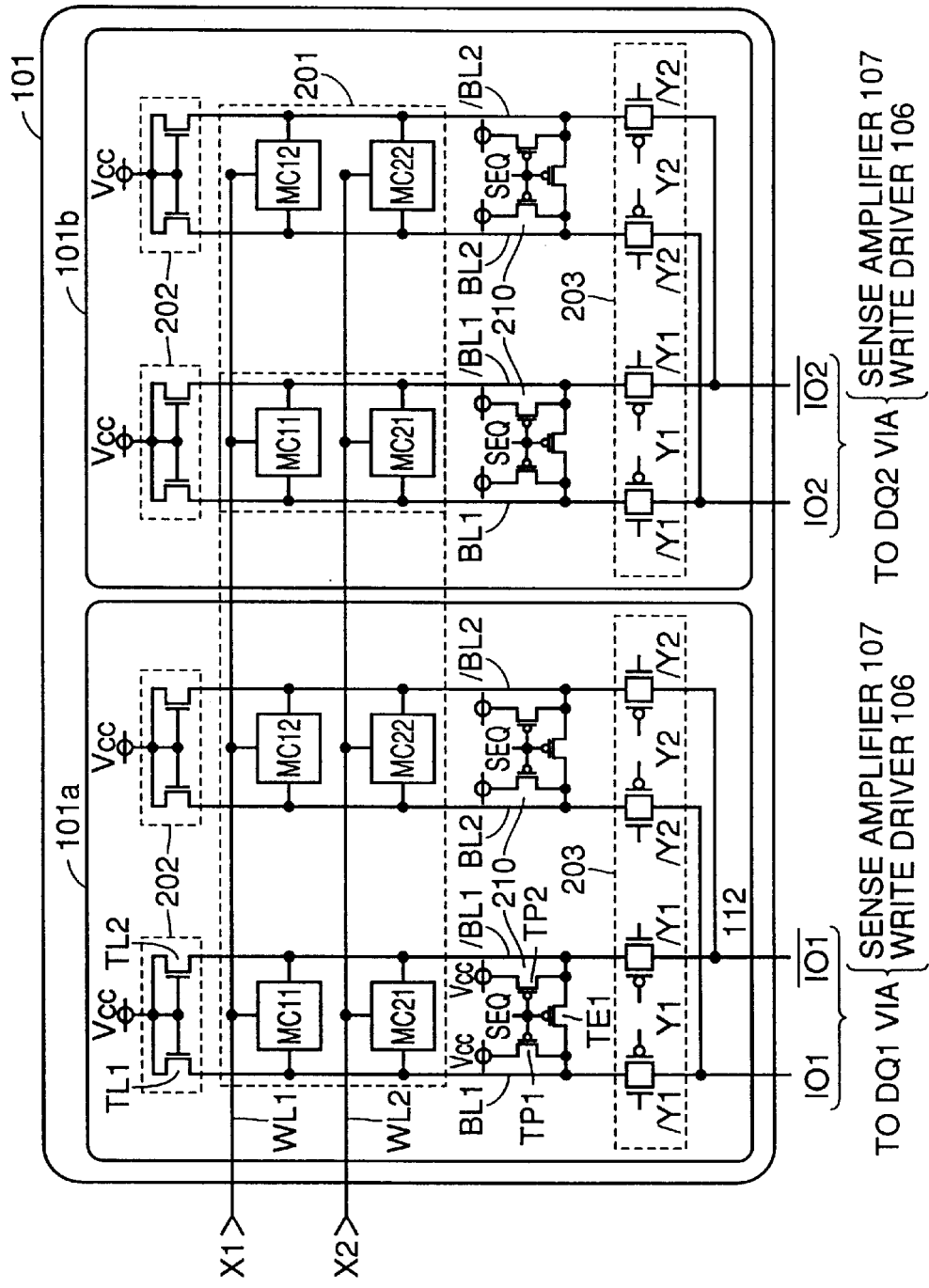
FIG. 2 is a block diagram to describe in more detail a structure of a memory block 101.

FIG. 2 is a block diagram to describe in further detail the structure of memory block 101 of FIG. 1. Memory block 102 has a structure analogous to that of memory block 101.

Referring to FIG. 2, memory block 101 includes a memory cell array 201 having memory cells arranged in rows and columns.

Memory block 101 further includes a sub block 101a corresponding to data input/output terminal DQ1 and a sub block 101b corresponding to data input/output terminal DQ2.

Each of sub blocks 101a and 101b includes a bit line load circuit 202 provided for each bit line pair, and a multiplexer 203 selectively connecting a memory cell column (bit line pair) that is controlled and selected by internal column address signals Y1 and /Y1 and Y2 and /Y2 output from column decoder 108 with one of write driver 106 and sense amplifier 107. In FIG. 2, write driver 106 and sense amplifier 107 provided for every memory cell column are not depicted.

Bit line load circuit 202 includes bit line load transistors TL1 and TL2 provided to supply current to a corresponding bit line pair from a power supply of a system different from that of the memory cell power supply. Each of bit line load transistors TL1 and TL2 is diode-connected.

Memory block 101 further includes a precharge power supply 210 provided corresponding to each bit line pair to supply a potential from a power supply of a system different from that of the memory cell power supply to precharge the bit line pair to an H (logical high) level.

Precharge power supply 210 includes P channel MOS transistors TP1 and TP2 to supply a potential from a power supply of a system different from that of the memory cell power supply to a bit line pair under control of a signal SEQ, and a P channel MOS transistor TE1 to equalize the potential of the pair of bit lines under control of signal SEQ.

Figure 3:
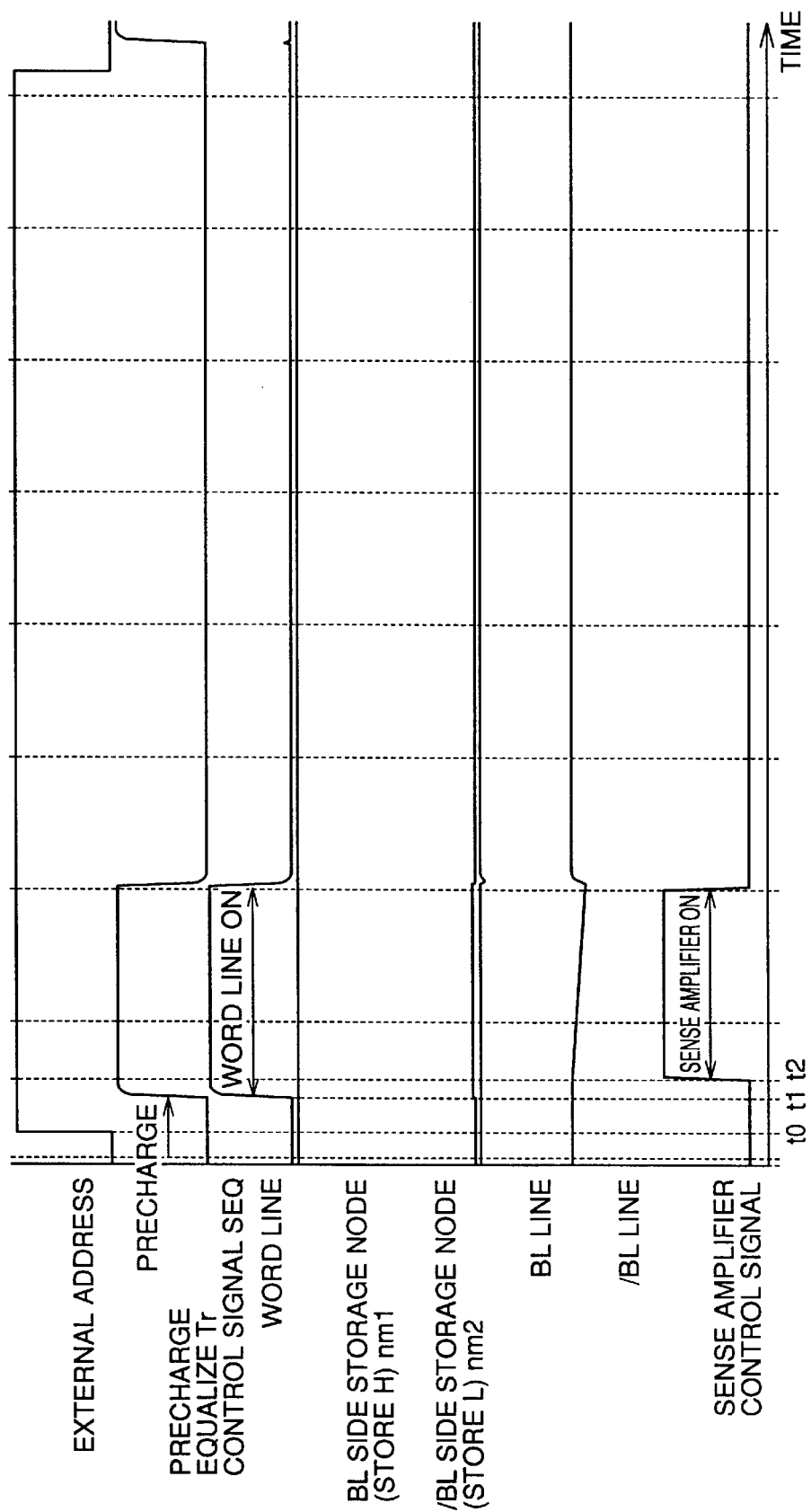
FIG. 3 is a timing chart to describe a readout operation from a memory cell of SRAM 1000.

FIG. 3 is a timing chart to describe a read out operation from a memory cell in SRAM 1000 of FIG. 1.

Figure 39:
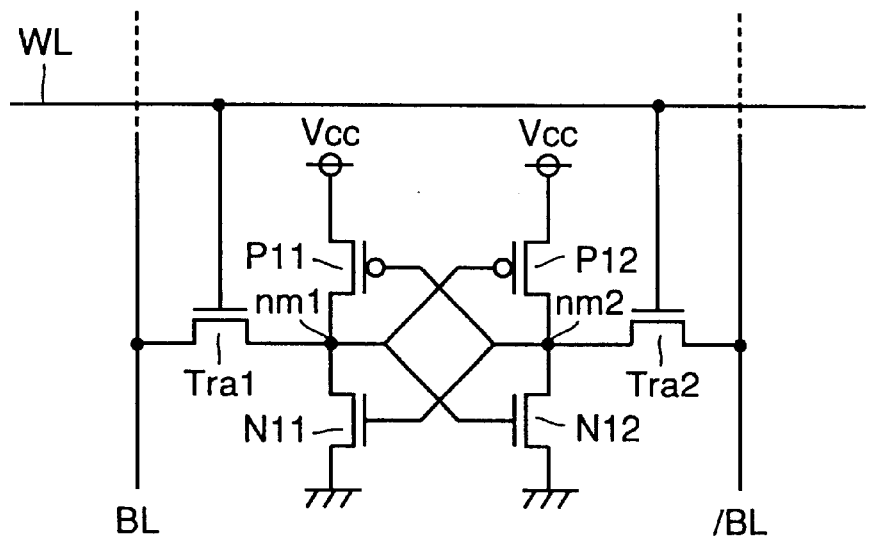
FIG. 39 is a circuit diagram showing a structure of a memory cell in a conventional SRAM.
Figure 40:
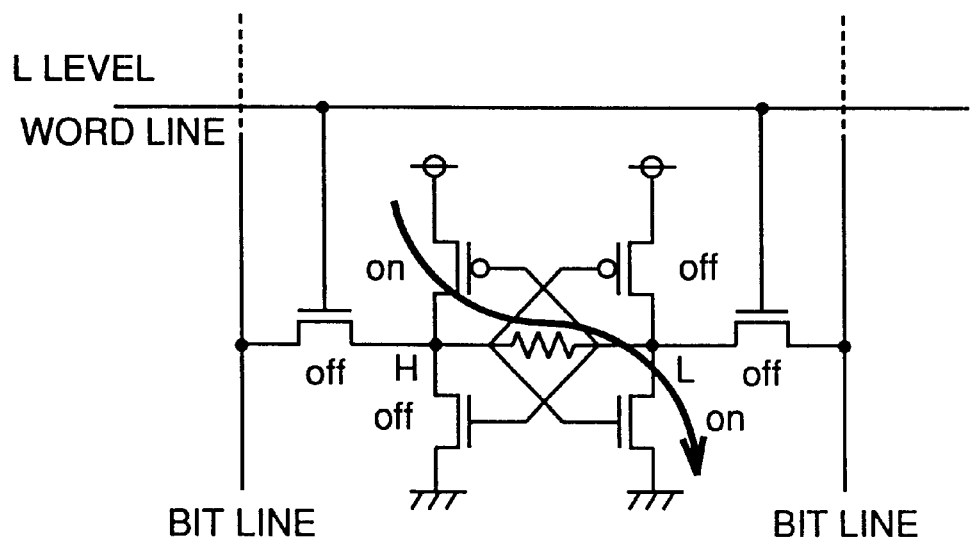
FIG. 40 is a diagram showing a concept of short-circuit between storage nodes in SRAM memory cells.

Memory cells MC11–MC22 of FIG. 2 have a structure similar to that of the conventional memory cell shown in FIG. 39. Data is stored by a latch formed of transistors P11, N11, P12 and N12.

Referring to FIG. 3, upon application of an external address at time t0, the bit line is precharged to an H level by precharge transistors TP1 and TP2 at time t1. Also, the address signal is decoded by row decoder 109, and the word line WL to be accessed is rendered active.

In the memory cell of the selected row, access transistors Tra1 and Tra2 are rendered conductive, whereby a column current flows to the bit line.

Accordingly, the potential of bit line /BL where the potential of the storage node is at an L level (logic low) is gradually reduced.

At time t2, the select signal from column decoder 108 is applied to multiplexer 203 according to a column address signal. The bit line pair of the column to be accessed is rendered active and also the sense amplifier control signal is rendered active. Sense amplifier 107 amplifies the potential difference generated between bit lines BL and /BL.

A block address signal to specify a memory block to be accessed is applied to block selector circuit 105. Block selector circuit 105 decodes the applied block address signal to generate a block select signal. A sense amplifier control signal selectively rendered active according to the block select signal is applied to sense amplifier 107. Only the data of the selected block is applied to data output buffer 110 via data bus 112.

Data output buffer 110 provides data when output enable signal OE is at an H level. When signal OE is at an L level, the input/output pad attains a high impedance state.

Figure 4:
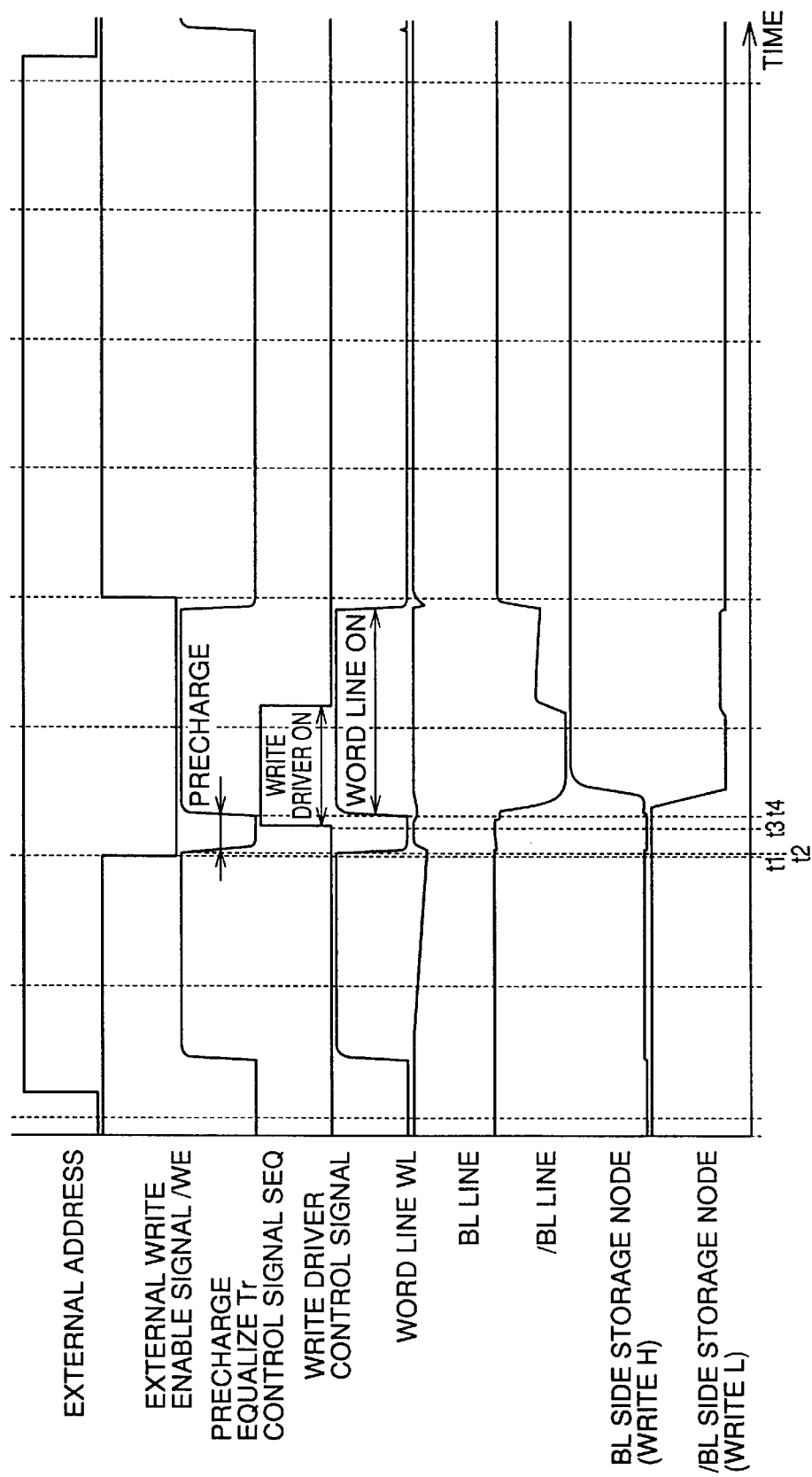
FIG. 4 is a timing chart to describe a write operation into a memory cell of SRAM 1000.

FIG. 4 is a timing chart to describe a write operation into a memory cell of SRAM 1000.

At time t0, an external address is applied to SRAM 1000.

The external data applied to input/output pads DQ1 and DQ2 are converted to the internal data level at data input buffer 111.

At time t1, data is output to data bus 112 when write enable signal /WE attains an L level in data input buffer 111.

At time t3, a write driver control signal selectively rendered active according to the block select signal generated from block selector circuit 105 is applied to write driver 106. Only write driver 106 corresponding to the selected block is rendered active.

The two bit lines BL and /BL are precharged to an H level by precharge transistors TP1 and TP2 during time t2–t4.

At time t4, a memory cell column is selected by multiplexer 203 according to the select signal from column decoder 108. By driving one bit line /BL down to the L level by the write buffer, data is written to bit line pair BL and /BL. Only one word line WL is rendered active by the column decoder. Access transistors Tra1 and Tra2 are rendered conductive, whereby data is written into one memory cell.

[Structure of Memory Cell Power Supply Line]

SRAM 1000 of the first embodiment implements a structure that allows a memory cell power supply line to attain a floating state for every one memory cell row (or for every one memory cell column).

Figure 5:
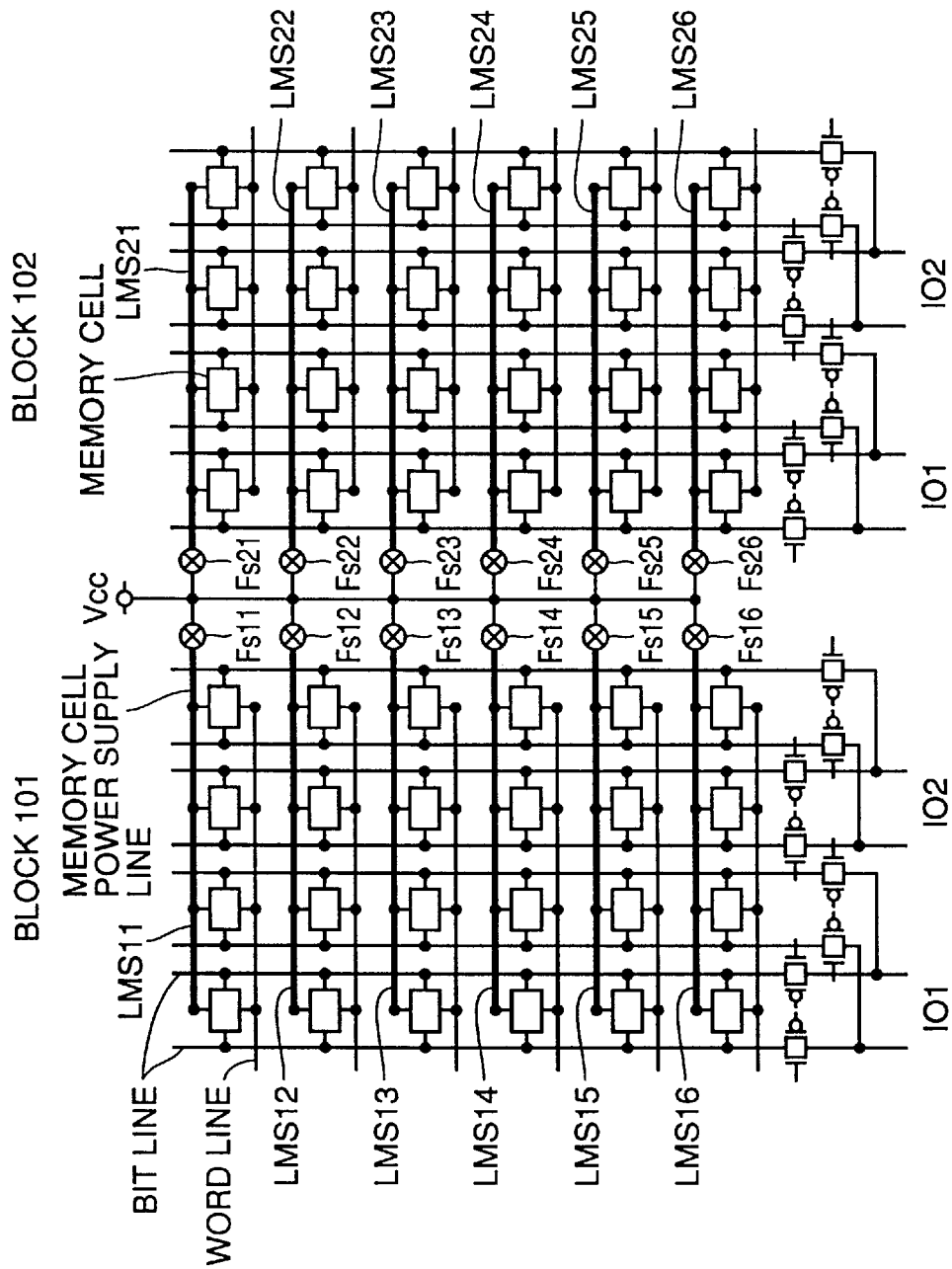
FIG. 5 is a schematic block diagram to describe a structure of a memory cell power supply line to supply power supply potential Vcc to each memory cell in a memory cell array of the first embodiment.

FIG. 5 is a schematic block diagram to describe a structure of a memory cell power supply line to supply power supply potential Vcc into each memory cell of a memory cell array in which a plurality of memory cells are arranged in an array.

Figure 8:
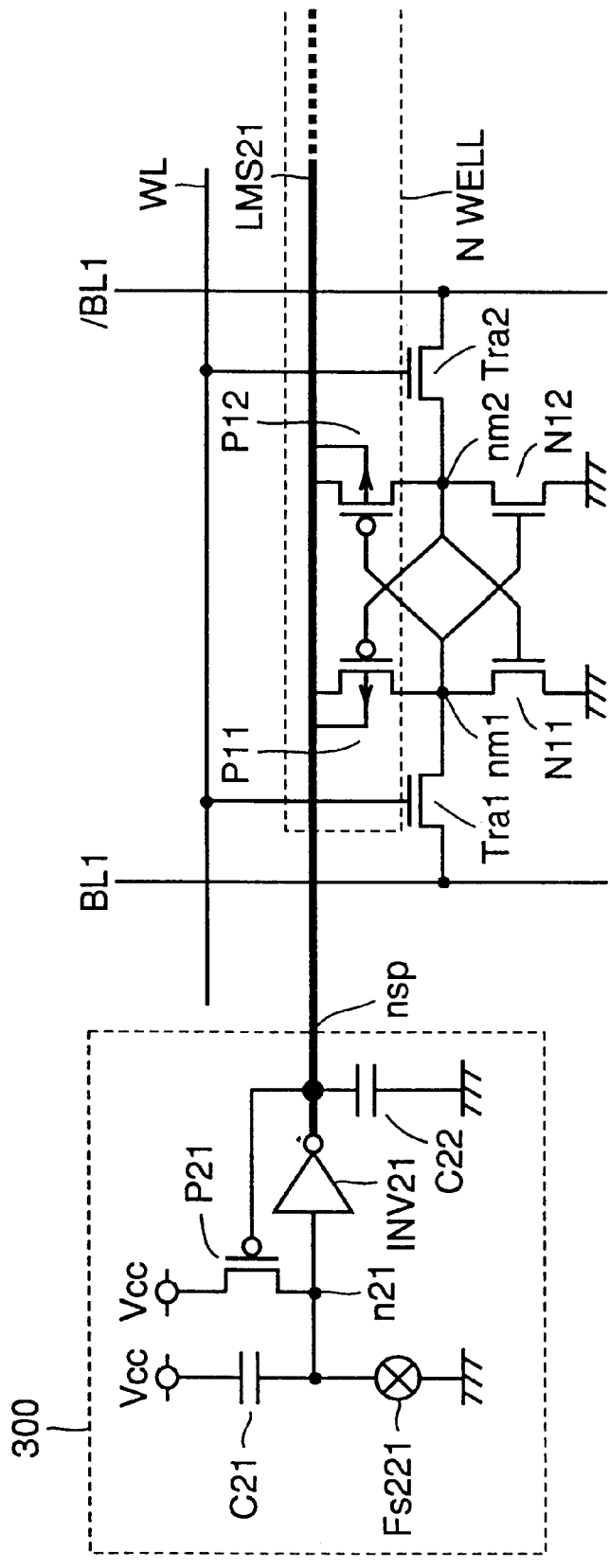
FIG. 8 is a partial block diagram of the portion associated with a memory cell power supply line LMS21 in the structure of a cell power supply set circuit 300.

For the sake of simplification, memory cell array 201 has a configuration of six rows and eight columns in FIG. 8. It is assumed that each of memory blocks 101 and 102 includes memory cells of six rows and four columns.

In the structure shown in FIG. 5, cell power supply lines LMS11–LMS16 supplying power supply potential Vcs to a memory cell extend in the line direction of the memory cell array in memory block 101. In memory block 102, cell power supply lines LMS21–LMS26 supplying power supply potential Vcs to the memory cell extend in the row direction of the memory cell array.

Fuse elements Fs11–Fs26 are arranged corresponding to memory cell power supply lines LMS11–LMS26, respectively.

Power supply potential Vcc is supplied to cell power supply lines LMS11–LMS26 via fuse elements Fs11–Fs26, respectively.

As shown in FIG. 5, a fuse element is attached to a memory cell power supply line connected in common to the plurality of memory cells in the row direction and not commonly shared in the column direction. This fuse element is decoupled when row redundancy replacement is to be performed as a result of presence of a defective bit.

According to such a structure of the memory cell power supply lines, the current path to the ground potential from the memory cell power supply line of the portion whose fuse element is decoupled is disconnected after redundancy replacement, so that the standby current can be completely cut.

As to the order to redundancy replacement when there are both a redundant row and a redundant column, replacement of a row is always carried out first, followed by replacement of a column.

The standby current can be cut in the case where the memory cell power supply line runs in the column direction by a similar way. In this case, the order of redundancy replacement when there are both a redundant row and a redundant column is always column replacement first, followed by row replacement.

Second Embodiment

The SRAM according to a second embodiment of the present invention is implemented to allow a memory cell ground line to attain a floating state for every one memory cell column (or one memory cell row). The remaining structure is similar to that of SRAM 1000 of the first embodiment. Therefore, description thereof will not be repeated.

Figure 6:
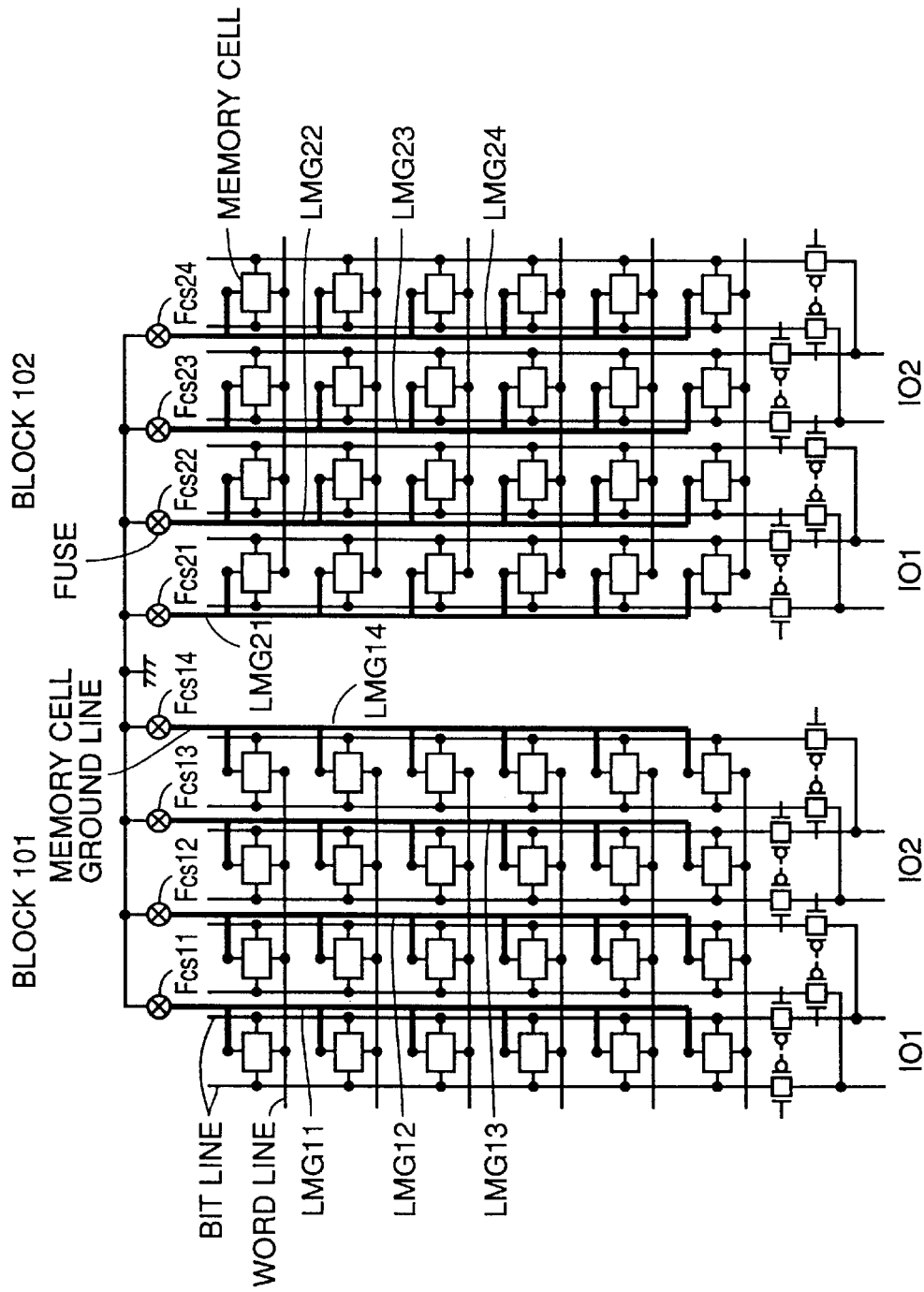
FIG. 6 is a schematic block diagram to describe a structure of a memory cell ground line to supply ground potential GND to each memory cell in a memory cell array according to a second embodiment of the present invention.

FIG. 6 is a schematic block diagram to describe the structure of a memory cell ground line to supply ground potential GND to each memory cell in a memory cell array where a plurality of memory cells are arranged in an array in the SRAM of the second embodiment.

For the sake of simplification, it is assumed that memory cell array 101 has structure of six rows and eight columns wherein each of memory blocks 101 and 102 includes memory cells of six rows and four columns in FIG. 6.

In memory block 101, memory cell ground lines LMG11–LMG14 supplying ground potential GND to a memory cell extend in the column direction in the memory cell array. In memory block 102, memory cell ground lines LMG21–LMG24 supplying ground potential GND to a memory cell are arranged to extend in the column direction in the memory cell array.

Fuse elements Fs11–Fs24 are arranged corresponding to memory cell ground lines LMG11–LMG24, respectively.

Power supply potential Vcc is supplied to cell power supply lines LMG11–LMG24 via fuse elements Fs11–Fs24, respectively.

More specifically, as shown in FIG. 6, a fuse that is connected in common to a plurality of memory cells in the column direction and not shared in the row direction is attached to a cell ground line. The fuse element is disconnected in carrying out column redundancy replacement due to the presence of a defective bit. Accordingly, the current path from the memory cell power supply potential line of the relevant portion to the memory cell ground line is disconnected after redundancy replacement, whereby the standby current is completely cut.

As to the order of redundancy replacement when there are both a redundant row and a redundant column, column replacement is first performed, followed by row replacement.

The standby current can be cut also in the case where the ground line runs in the row direction by a similar way. As to the order of redundancy replacement when there are both a redundant row and a redundant column, row replacement is first performed, followed by column replacement.

There is also the advantage that the standby current caused by bit line ground line short-circuit can also be reduced for the layout where the memory cell ground line runs in the column direction.

Third Embodiment

The SRAM according to a third embodiment of the present invention has a structure that can have the current path from the memory cell power supply potential to the ground potential cut for every one memory cell row (or for every one memory cell column), similar to the first embodiment. The SRAM of the third embodiment can also fix the potential level of the corresponding memory cell power supply line to the ground potential level for every memory cell row (or memory cell column) including the defective memory cell.

In the case where the line that supplies the potential of the N well of a memory cell PMOS transistor is shared as a memory cell power supply line, the memory cell power supply line attaining a floating state due to the cut off of the fuse as shown in the first embodiment becomes the cause of latch up and leakage current due to the unstable potential of the N well.

Figure 7:
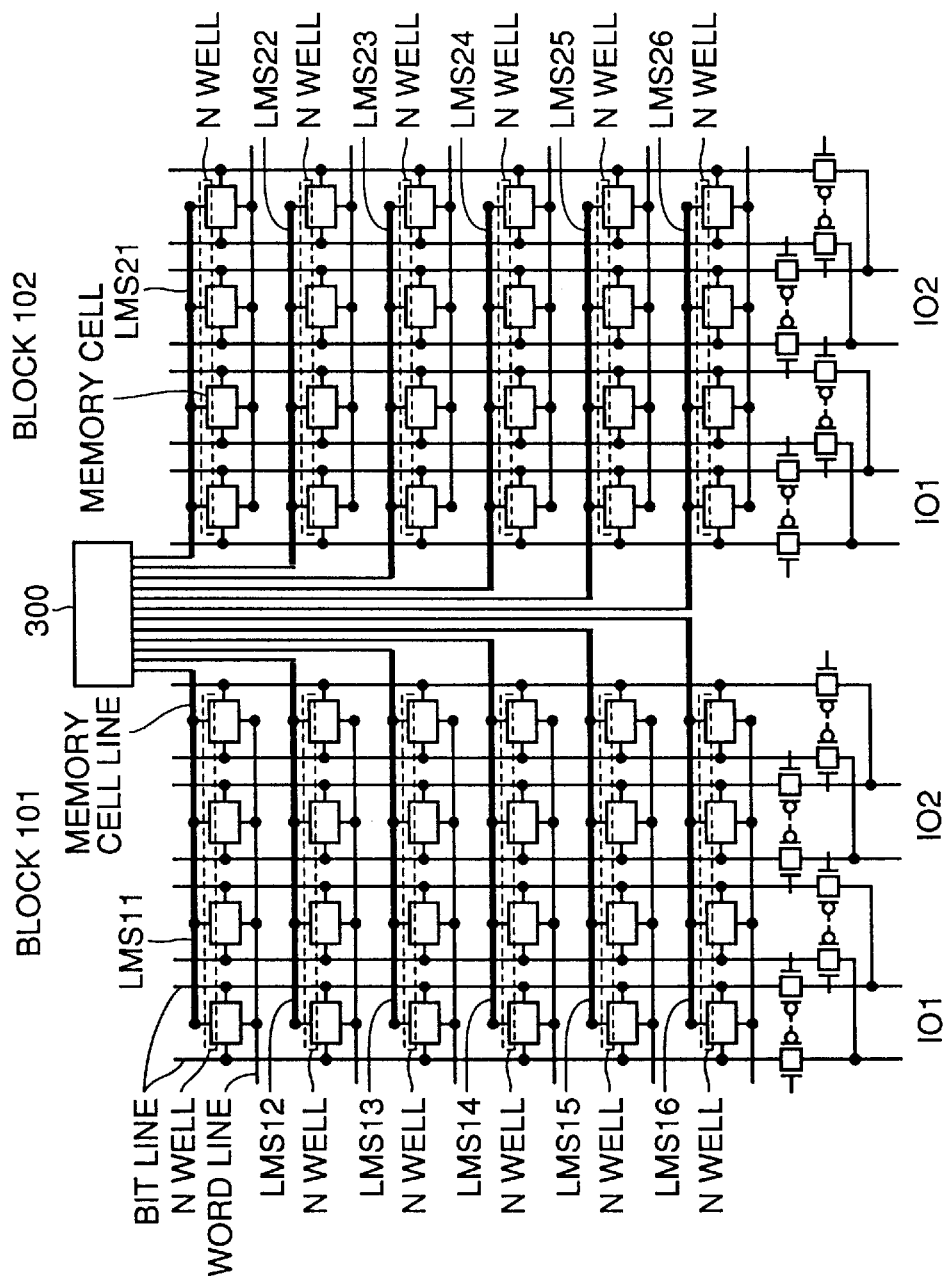
FIG. 7 is a schematic block diagram to describe a structure of a memory cell power supply line to supply power supply potential Vcc to each memory cell in a memory cell array according to a third embodiment of the present invention.

FIG. 7 is a schematic block diagram to describe a structure of a memory cell power supply line to supply power supply potential Vcc to each memory cell in a memory cell array where a plurality of memory cells are arranged in an array in the SRAM of the third embodiment.

In each of memory blocks 101 and 102 in FIG. 7, the N well is isolated for every row of memory cells.

Power supply potential is supplied from cell power supply set circuit 300 to memory cell power supply lines LMS11–LMS26.

FIG. 8 is a partial block diagram of the extraction of the portion associated with memory cell power supply line LMS21 out of the structure of cell power supply set circuit 300 of FIG. 7.

A similar structure is provided corresponding to the other memory cell power supply lines LMS11–LMS16 and LMS22–LMS26.

In the structure of memory cell MC in FIG. 8, components corresponding to those of the conventional memory cell of FIG. 39 have the same reference characters allotted, and description thereof will not be repeated.

Referring to FIG. 8, P channel MOS load transistors P11 and P12 among the transistors that form memory cell MC receive power supply potential Vcc from a potential supply node nsp of cell power supply set circuit 300 via cell power supply line LMS21. The N well of P channel MOS load transistors P11 and P12 receive power supply potential Vcc via cell power supply line LMS21.

Cell power supply set circuit 300 includes a capacitor C21 and a fuse element Fs221 connected in series between power supply potential Vcc and ground potential GND, a P channel MOS transistor P21 provided between connection node n21 of capacitor C21 and fuse element Fs221 and power supply potential Vcc, an inverter INV21 receiving potential of node n21 at its input node to apply an inverted potential to node nsp, and a capacitor C22 provided between the output node (node nsp) of inverter INV21 and ground potential GND. The output node of inverter INV21 is coupled to the gate of transistor P21.

As power supply voltage Vcc, the level of an externally supplied voltage or the output of an internal power supply circuit (not shown) that converts the level of an external power supply to an internal power supply can be used.

In redundancy replacement due to the presence of a defective bit, disconnection of fuse Fs221 in cell power supply set circuit 300 of FIG. 8 allows memory cell power supply line LMS21 commonly connected to a plurality of memory cells in the row direction to be fixed at the ground level.

Accordingly, following redundancy replacement, the current path from the memory cell power supply line of this portion to the ground line is disconnected as a result of the P channel MOS transistor in inverter INV21 being turned off, whereby the standby current can be cut. Furthermore, the potential of the N channel can be fixed to the ground potential.

A structure in which the N well is isolated for every memory cell row and a memory cell power supply line is provided for every memory cell row has been described. However, the present invention is not limited to such a structure, and a structure in which the N well is isolated for every memory cell column and a memory cell power supply line is provided for every memory cell row can be implemented.

The power supply line supplying power supply potential to cell power supply set circuit 300 and the power supply line supplying the power supply potential to bit line load circuit 202 and precharge circuit 203 may be power supply lines of different systems.

Fourth Embodiment

The SRAM according to a fourth embodiment of the present invention is directed to a structure that allows the current path from a memory cell power supply potential to a ground potential to be cut for every one memory cell column (or for every one memory cell row), similar to the second embodiment. In the SRAM of the fourth embodiment, the corresponding memory cell ground line can be fixed to the level of power supply potential Vcc for every memory cell column (or memory cell row) that includes the defective memory cell.

More specifically, when the line supplying the potential of the P well of the memory cell NMOS transistor is commonly shared as a memory cell ground line, the memory cell ground line attaining a floating state due to the cut off of the fuse as in the second embodiment becomes the cause of latch up or leakage current due to an unstable P well potential.

Figure 9:
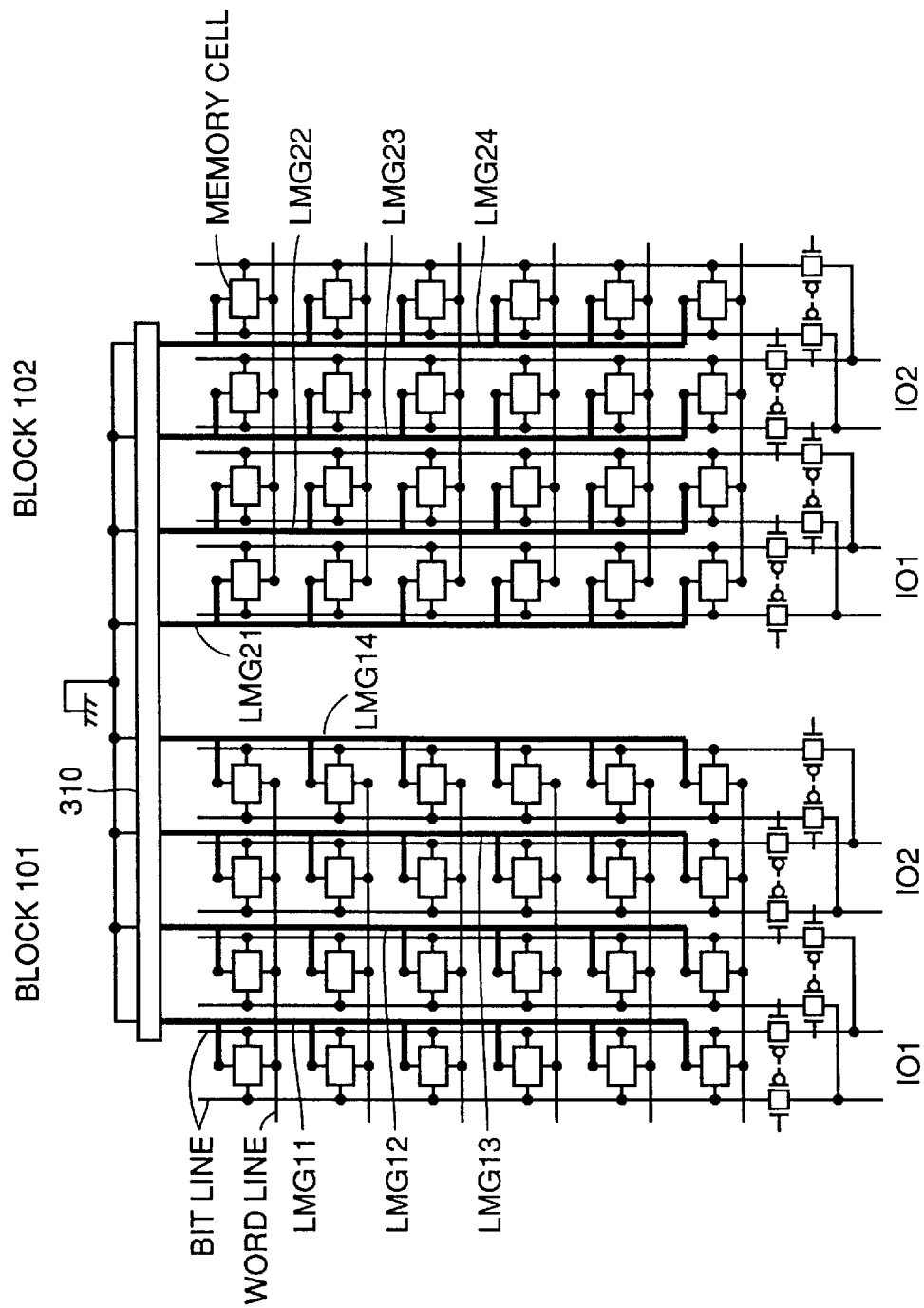
FIG. 9 is a schematic block diagram to describe a structure of a memory cell ground line to supply ground potential GND to each memory cell in a memory cell array according to a fourth embodiment of the present invention.

FIG. 9 is a schematic block diagram to describe a structure of a memory cell ground line to supply ground potential GND to each memory cell in a memory cell array where a plurality of memory cells are arranged in an array in the SRAM of the fourth embodiment.

In each of memory blocks 101 and 102 in FIG. 9, the P well is isolated for every memory cell column.

Ground potential is supplied from cell ground set circuit 310 to memory cell ground lines LMG11–LMG24.

Figure 10:
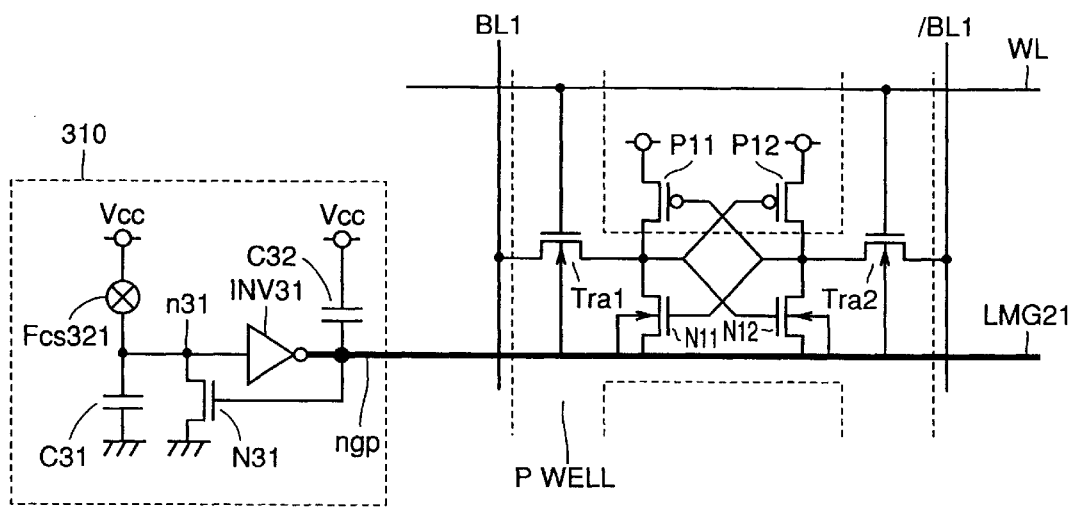
FIG. 10 is a partial block diagram of the portion associated with memory cell ground line LMG 21 of the structure of a cell ground set circuit 310 of FIG. 9.

FIG. 10 is a partial block diagram of the extraction of the portion associated with memory cell ground line LMG21 out of the structure of cell ground set circuit 310 of FIG. 9.

A similar structure is provided corresponding to the remaining memory cell ground lines LMG11–LMG14 and LMG22–LMG24.

In the structure of memory cell MC in FIG. 10, components corresponding to those of the structure of the conventional memory cell of FIG. 39 have the same reference characters allotted, and description thereof will not be repeated.

Referring to FIG. 10, N channel MOS driver transistors N11 and N12 among the transistors forming memory cell MC receive ground potential GND via a cell ground line LMG21 from a potential supply node ngp of cell ground set circuit 310. The P well corresponding to N channel MOS driver transistors N11 and N12 and N channel access transistors Tra1 and Tra2 receive the supply of ground potential GND via cell ground line LMG21.

Cell ground set circuit 310 includes a fuse element Fs321 and a capacitor C31 connected in series between power supply potential Vcc and ground potential GND, an N channel MOS transistor N31 provided between a connection node n31 of fuse element Fs321 and capacitor C31 and ground potential GND, an inverter INV31 receiving the potential of node N31 at its input node to apply an inverted potential to node ngp, and a capacitor C32 provided between the output node of inverter INV31 (node ngp) and power supply potential Vcc. The output node of inverter INV31 is coupled to the gate of transistor N31.

In cell ground set circuit 310 of FIG. 10, memory cell ground line LMG21 connected in common to a plurality of memory cells in the column direction is fixed to the level of power supply potential Vcc by decoupling fuse Fs321 at the same time when redundancy replacement is to be performed due to the presence of a defective bit.

Accordingly, after redundancy replacement, the current path from the memory cell power supply line of this portion to the ground line is disconnected by the N channel MOS transistor in inverter INV31 being turned off, whereby the standby current is cut. Also, the potential of the P well can be fixed to the level of power supply potential Vcc.

A structure has been described in which the P well is isolated for every column of memory cells and a memory cell ground line is provided for every column of memory cells. The present invention is not limited to such a structure, and a structure can be implemented in which the P well is isolated for every row of memory cells and a memory cell ground line is provided for every row of memory cells.

In the case of a layout where the memory cell ground line runs in the column direction, the standby current flowing caused by a short-circuit between a bit line and a memory cell ground line can also be reduced.

Fifth Embodiment

An SRAM according to a fifth embodiment of the present invention is directed to a structure that allows suppression of leakage current in a defective memory cell when the memory cell power supply line is set to a floating state (or ground potential level) or when the memory cell ground line is set to a floating state (or power supply potential Vcc level) by a one-time replacement of a plurality of rows.

More specifically, when a divisional word line method is employed, redundancy replacement of a plurality of rows at one time is often performed in a plurality of units of memory cell rows RU1–RU3 selected by a row select signal MAINWL generated by a main decoder 109.

Figure 11:
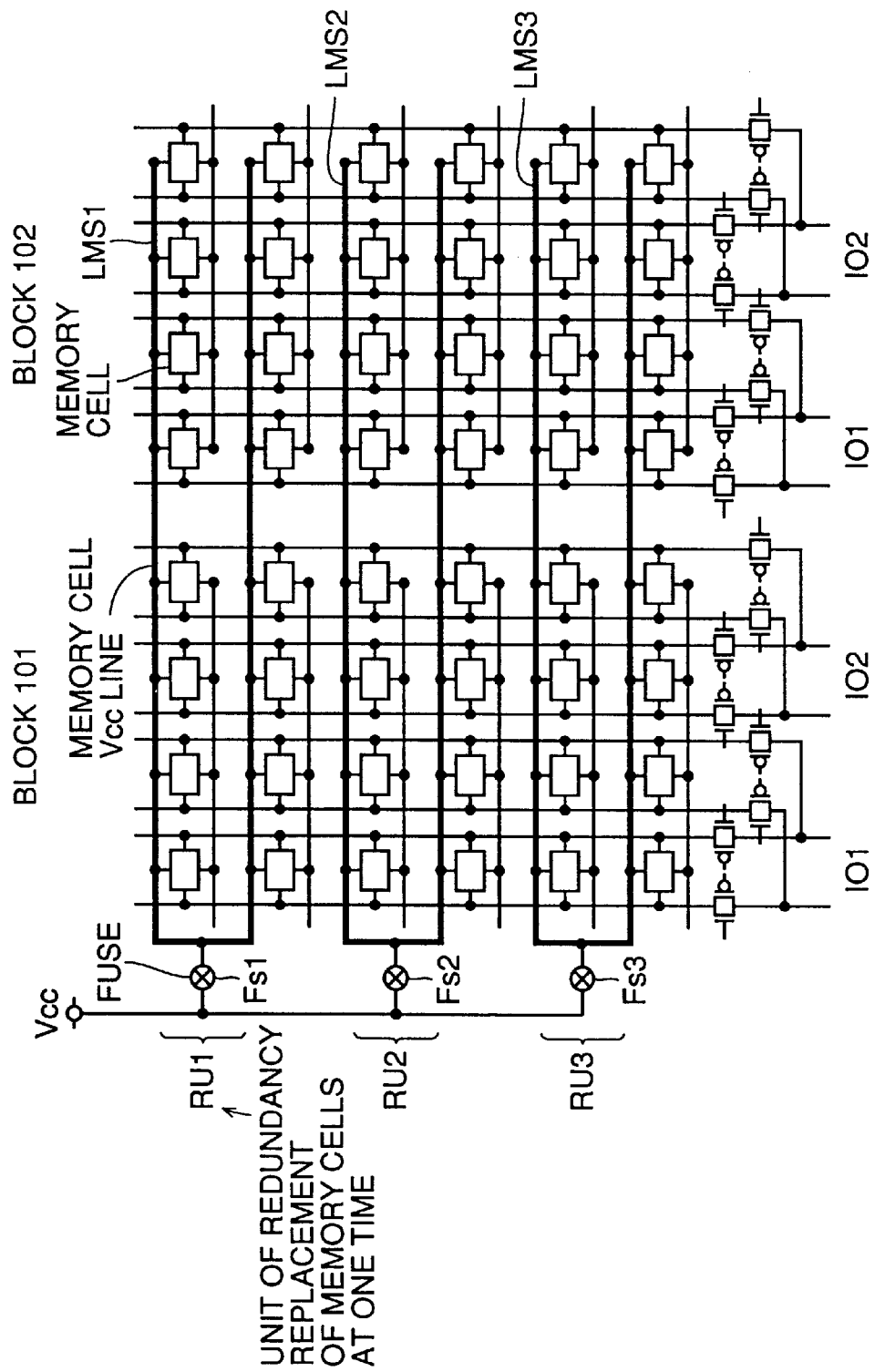
FIG. 11 is a schematic block diagram to describe a structure of a memory cell power supply line to supply power supply potential Vcc for each of memory cell row units RU1–RU3.

FIG. 11 is a schematic block diagram to describe a structure of a memory cell power supply line to supply a power supply potential Vcc into each memory cell of a memory cell array where a plurality of memory cells are arranged in an array in every memory cell row units RU1–RU3.

Referring to FIG. 11, each of memory cell row units RU1–RU3 includes two memory cell rows over memory blocks 101 and 102. Cell power supply lines LMS1–LMS3 are provided corresponding to memory cell row units RU1–RU3, respectively. Fuse elements Fs1–Fs3 are provided for every memory cell row units RU1–RU3 corresponding to the unit of one-time replacement of redundant rows. Power supply potential Vcc is supplied to cell power supply lines LMS1–LMS3 via fuse elements Fs1–Fs3, respectively.

By virtue of such a structure, the number of fuses can be reduced to save the layout area.

The structure of FIG. 11 may be implemented in which power supply potential Vcc from cell power supply set circuit 300 is supplied to each of cell power supply lines LMS1–LMS3, as in the second embodiment.

A cell ground line is provided for every memory cell row units RU1–RU3, and the ground potential is supplied via respective fuse elements Fs1–Fs3. In this case, a structure may be implemented in which the ground potential from cell ground set circuit 310 is supplied to the cell ground line provided for every memory cell row units RU1–RU3, as in the fourth embodiment.

The above structure has been described in which one-time redundancy replacement is performed for every memory cell row units RU1–RU3 including a plurality of memory cell rows. The present invention is not limited to this structure, and a structure may be implemented in which one-time redundancy replacement is carried out for every memory cell column unit including a plurality of memory cell columns.

In this case, a cell power supply line is provided for every memory cell column unit, and the power supply potential is supplied to the cell power supply line via respective fuse elements. Also, a structure in which power supply potential Vcc from cell power supply set circuit 300 is supplied to each cell power supply line can be implemented, as in the third embodiment.

Also, a structure may be implemented in which a cell ground line is provided for every memory cell column unit, supplying a ground potential via respective fuse elements. In this case, a structure can be implemented in which the ground potential from cell ground set circuit 310 is supplied to the cell ground line provided for every memory cell column unit, as in the fourth embodiment.

In other words, in the case of a layout where the memory cell power supply line or memory cell ground line is shared between adjacent plurality of memory cells, the memory cell power supply line or memory cell ground line is provided independently for every one-time redundancy replacement unit.

When the memory cell ground line is set to a floating state or a power supply potential level in a layout where the memory cell ground line runs in the column direction, the standby current caused by short-circuiting between a bit line and a ground line can be reduced.

Sixth Embodiment

An SRAM according to a sixth embodiment of the present invention has a layout in which memory cell power supply lines LMS11–LMS14 and LMS21–LMS24 are arranged in the memory cell column direction. The SRAM of the sixth embodiment has a structure in which the bit line load power supply line that supplies the power supply potential to bit line load circuit 200 is set to a floating state (or ground level) by the fuse that sets the memory cell power supply line to a floating state (or ground level).

Figure 12:
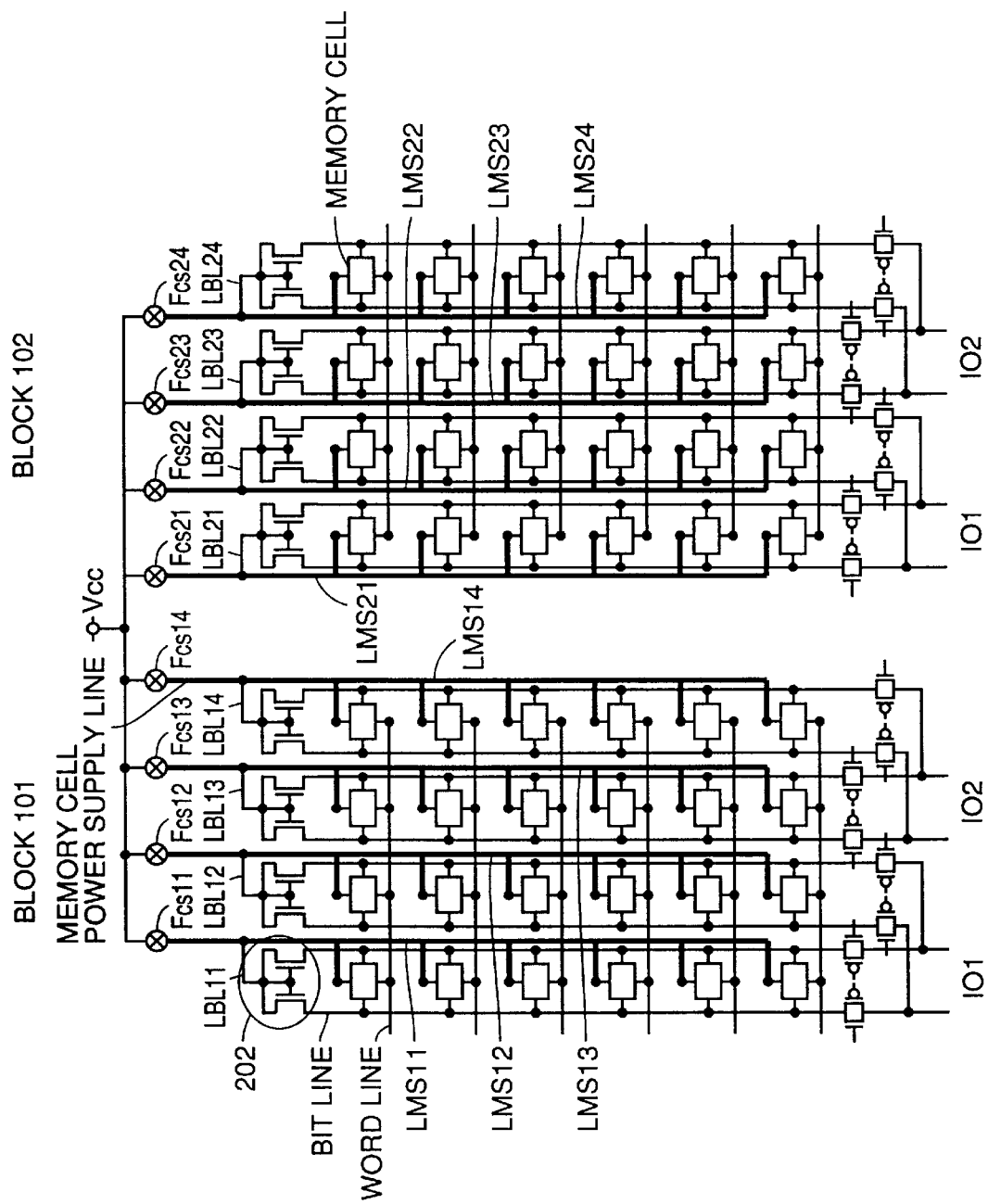
FIG. 12 is a block diagram to describe redundancy replacement according to a sixth embodiment of the present invention.

FIG. 12 is a block diagram to describe redundancy replacement of the sixth embodiment.

When memory cell power supply lines LMS11–LMS24 run in the memory cell column direction as shown in FIG. 12, fuse elements Fcs11–Fcs24 are arranged in common for each set of memory cell power supply lines LMS11–LMS24 and bit line load power supply lines LBL11–LBL24 that supply power supply potential Vcc to bit line load circuit 202.

Accordingly increase of the standby current caused by short-circuit between the bit line and the ground line can be suppressed as well as the increase of the standby current caused by short-circuit between the storage nodes of the memory cell.

The structure of FIG. 12 can be implemented in which power supply potential Vcc from cell power supply set circuit 300 is supplied to each of cell power supply lines LMS11–LMS24, as in the third embodiment.

Seventh Embodiment

An SRAM according to a seventh embodiment of the present invention is directed to a structure in which a fuse element to drive a memory cell power supply line LMS to the ground level (or fuse element that drives memory cell ground line LMG to the level of power supply potential Vcc) is also used as the fuse element to specify the redundancy replacement address in the case where redundancy replacement for each one row is to be carried out.

Figure 13:
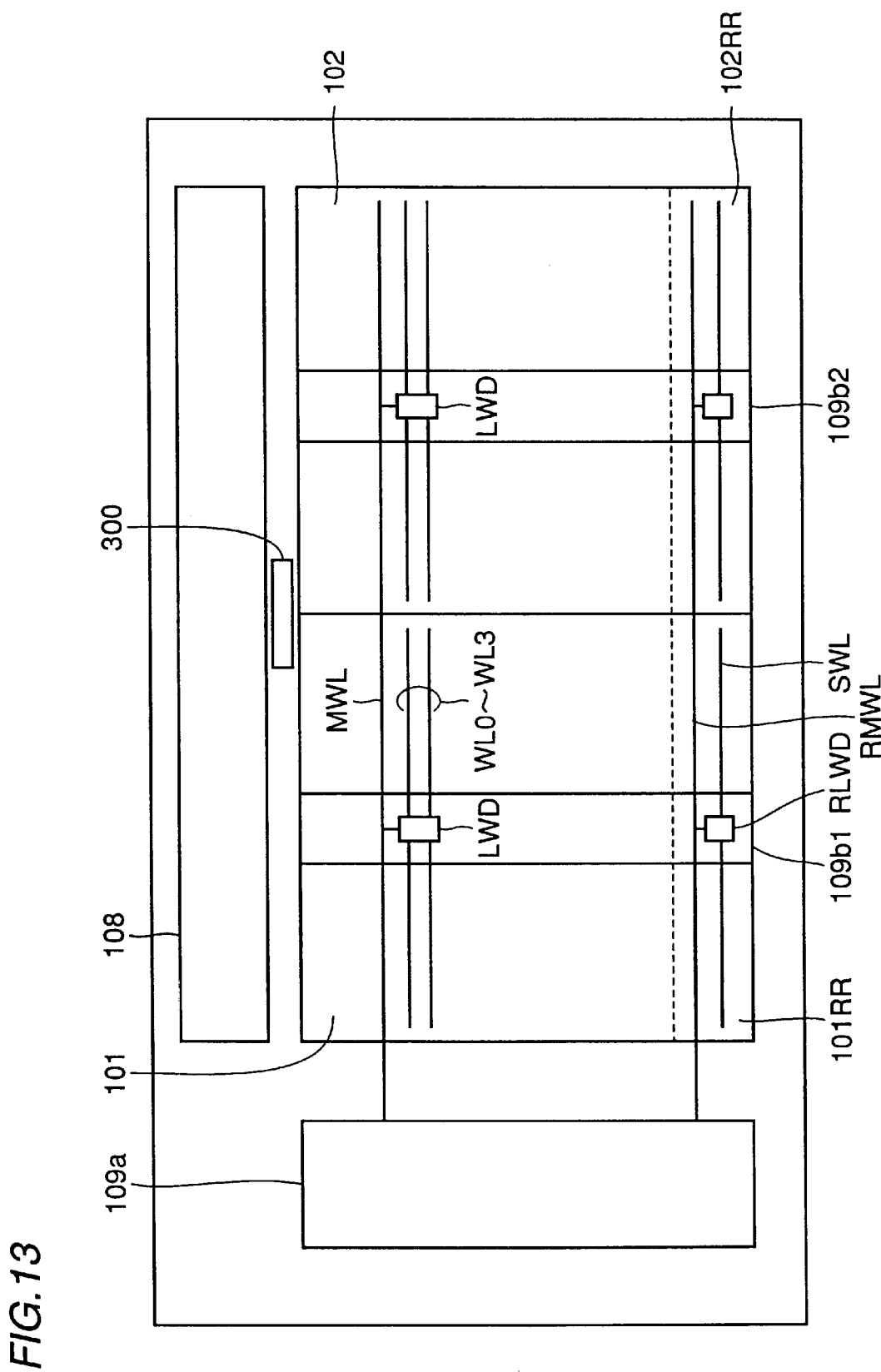
FIG. 13 is a schematic block diagram to describe a structures of a memory cell array, a row decoder, and a column decoder according to a seventh embodiment of the present invention.

FIG. 13 is a schematic block diagram to describe the structure of a memory cell array, a row decoder and a column decoder according to the seventh embodiment.

As shown in FIG. 13, the SRAM of the seventh embodiment has the structure of a row decoder that carries out row selection and a word line taking the so-called divisional word line method.

More specifically, row decoder 109 includes a main row decoder 109a to selectively drive a main word line MWL, and local decoder units 109b1 and 109b2 provided corresponding to memory cell arrays 101 and 102, respectively, to drive a sub word line.

Corresponding to one main word line MWL, a local decoder LWD is provided for each of local decoder units 109b1 and 109b2. Local decoder LWD selectively renders active any one of sub word lines WL0–WL3 by sub decode signals ¼SELECT0–3.

Similar to the structure shown in FIG. 1, when there is a defect in a memory cell within memory block 101, a redundant memory cell row 101RR to effect repair by redundancy replacement is provided with respect to memory block 101. Also, a redundant memory cell row 102RR is provided corresponding to memory block 102 in order to carry out repair by redundancy replacement when there is a defect in the memory cell in memory block 102.

In redundant memory cell rows 101RR and 102RR, a local decoder RLWD is provided for each of local decoder units 109b1 and 109b2 corresponding to one redundant main word line RMWL. Local decoder RLWD selectively renders a spare word line SWL active.

Similar to that shown in FIG. 7, a cell power supply set circuit 300 to control the potential supplied to memory cell power supply line LMS is provided.

Figure 14:
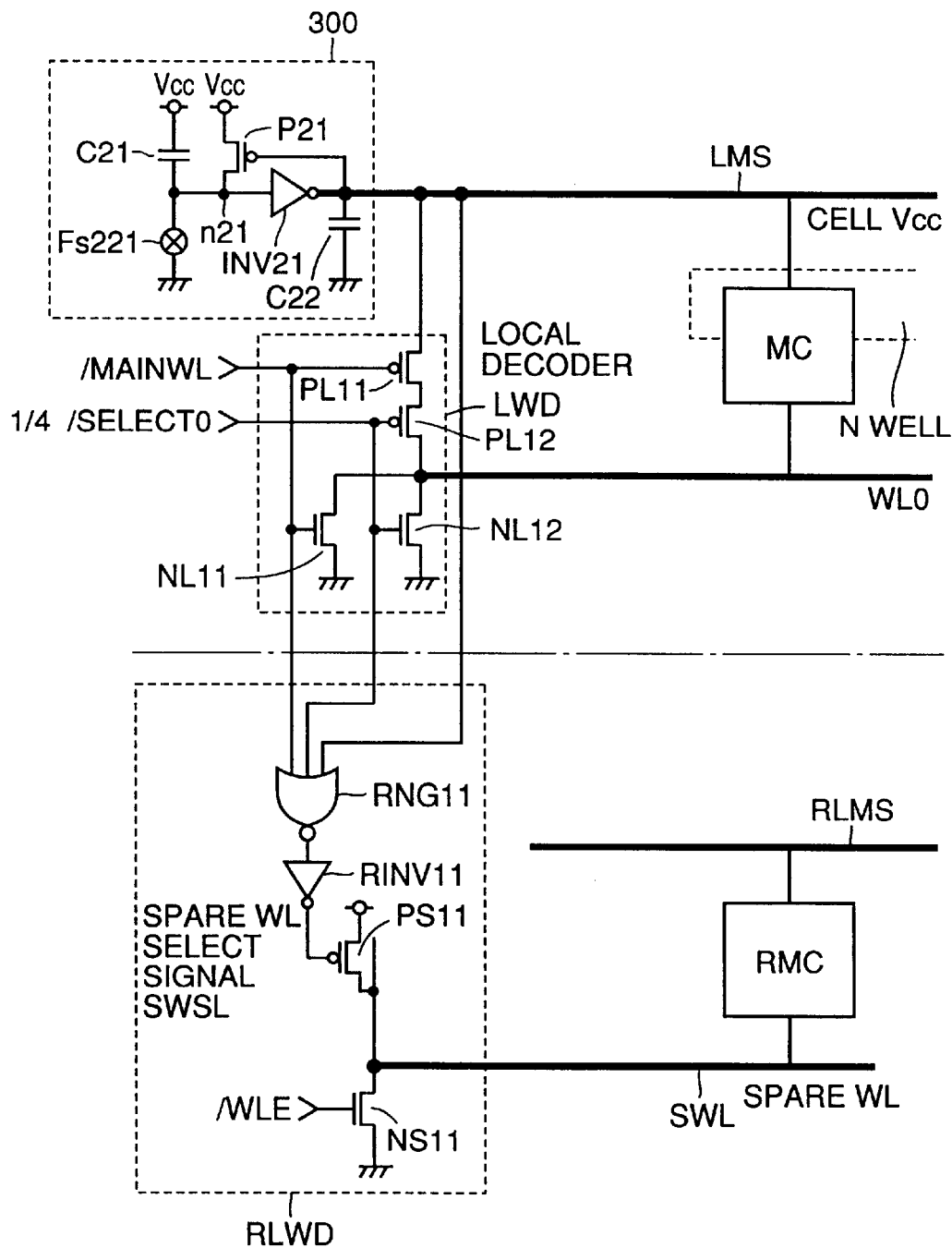
FIG. 14 is a block diagram of a spare word line SWL corresponding to the redundant row that is to be replaced when there is a defect in a memory cell MC connected to a sub word line WL0.

FIG. 14 is a block diagram of an extraction of one sub word line WL0 and a spare word line SWL corresponding to the redundant row that is replaced when there is a defect in memory cell MC connected to sub word line WL0, out of the structure of FIG. 13.

Referring to FIG. 14, power supply potential Vcc is supplied by memory cell power supply line LMS from cell power supply set circuit 300 to the regular memory cell MC and the N well thereof. Power supply potential Vcc is supplied to redundant memory cell RMC and the N well thereof by a redundant cell memory cell power supply line RLMS.

In redundancy replacement, fuse element Fs221 in cell power supply sets circuit 300 is disconnected, whereby the potential of memory cell power supply line LMS is fixed to the ground potential.

Local decoder LWD includes a P channel MOS transistor PL11 having a gate potential controlled by a signal /MAINWL that attains an L level in response to activation of main word line MWL, and having a source connected to memory cell power supply line LMS, a P channel MOS transistor PL12 provided between the drain of transistor PL11 and sub word line WL0 and having a gate potential controlled by a sub decode signal /¼SELECT0 that attains an L level in an active state, an N channel MOS transistor NL11 provided between sub word line WL0 and the ground potential, having a gate potential controlled by signal /MAINWL, and an N channel MOS transistor NL12 provided between sub word line WL0 and the ground potential, and having a gate potential controlled by sub decode signal /¼SELECT0. Although not shown in FIG. 14, local decoder LWD can receive sub decode signals /¼SELECT1–3 instead of sub decode signal /¼SELECT0 to drive sub word lines WL1–WL3.

Redundant local decoder RLWD to drive a spare word line SWL in redundancy replacement includes a 3-input NOR gate RNG11 receiving the potential of memory cell power supply line LMS, signal /MAINWL, and sub decode signal /¼SELECT0, an inverter RINV11 receiving and inverting the output of NOR gate RNG11 to generate a spare word line select signal SWSL, a P channel MOS transistor PS11 provided between power supply potential Vcc and spare word line SWL to receive signal SWSL at its gate, and an N channel MOS transistor NS11 provided between spare word line SWL and the ground potential to receive at its gate a signal /WLE that attains an L level in response to activation of redundant main word line RMWL.

When fuse element Fc221 in cell power supply set circuit 300 is decoupled in the case where replacement of redundant column is to be carried out, the potential level of memory cell power supply line LMS attains the level of the ground potential, and signal /MAINWL and sub decode signal /¼SELECT0 to select sub word line WL0 both attain an L level. As a result, signal SWSL attains an L level, and P channel MOS transistor PS11 is rendered conductive, whereby spare word line SWL is rendered active.

In contrast to the first to sixth embodiments in which a fuse element for the memory cell power supply line is newly required in addition to the fuse element to specify a redundancy replacement address, fuse element Fc221 to set the memory cell power supply line to the level of the ground voltage can be used in common as the fuse element to specify a redundancy replacement address by virtue of the structure shown in FIG. 14. Therefore, increase in the layout area can be suppressed.

More specifically, by decoupling the fuse element that renders the memory cell power supply line to the ground level, the regular word line will not be rendered active even if the select signal with respect to the regular word line arrives. The spare word line is rendered active instead. Therefore, the fuse for the memory cell redundancy replacement and the program circuit are omittable to allow reduction in the layout area.

The above structure is described in which the fuse element that renders the memory cell power supply line to the ground level is used in common as the fuse element to specify a redundancy replacement address in the row redundancy replacement for each one row. However, a structure is also allowed in which the fuse element that renders the memory cell ground line to the level of power supply potential Vcc can be used in common as the fuse element to specify a redundant replacement address in the structure where row redundancy replacement for one row is carried out.

When the fuse element that renders the memory cell ground line to the level of power supply potential Vcc is used as the fuse element for memory cell redundancy replacement, the portion of cell power supply set circuit 300 is modified as cell ground set circuit 310 as shown in FIG. 10, out of the circuit structure of FIG. 14. As to the input signal to logic circuit RNG11, the potential of the input node of inverter INV31 is applied instead of the potential of memory cell power supply line LMS.

Furthermore, application to column redundancy is allowed by taking the potential of the word line described above as a column select signal in column redundancy employing a column select signal of H enable.

In the case where the fuse element to set the memory cell power supply line to the ground level is used in common only for the fuse element for non-selection of a defective row and a fuse element for spare row selection is to be provided separately, redundancy local decoder RLWD of FIG. 14 is no longer required.

[Modification 1 of Seventh Embodiment]

Figure 15:
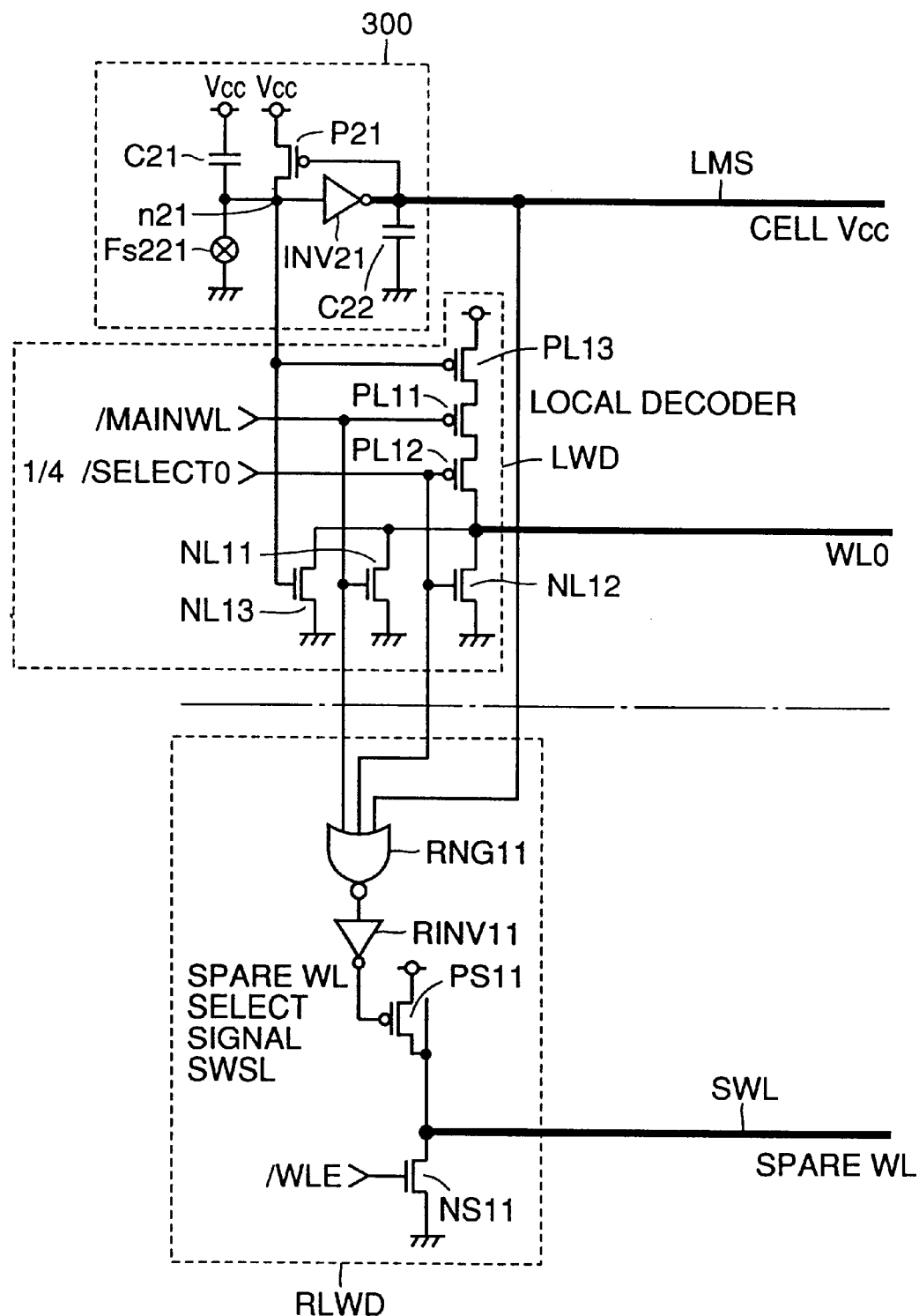
FIGS. 15, 16 and 17 are schematic block diagrams showing first, second and third modifications, respectively, of the structure of the seventh embodiment shown in FIG. 14.

FIG. 15 is a schematic block diagram showing a first modification of the structure of the seventh embodiment shown in FIG. 14.

The structure of FIG. 15 differs from the structure of FIG. 14 in local decoder LWD.

Referring to FIG. 15, local decoder LWD of the first modification includes a P channel MOS transistor PL13 having its gate potential controlled by an internal node n21 of cell power supply set circuit 300, and receiving power supply potential Vcc at its source, a P channel MOS transistor PL11 having its gate potential controlled by signal /MAINWL, and having its source connected to the drain of transistor PL13, a P channel MOS transistor PL12 connected between the drain of transistor PL11 and sub word line WL0, having its gate potential controlled by signal /¼SELECT0, an N channel MOS transistor NL11 connected between sub word line WL0 and the ground potential, and having its gate potential controlled by signal /MAINWL, an N channel MOS transistor NL12 provided between sub word line WL0 and the ground potential, and having its gate potential controlled by sub decode signal /¼SELECT0, and an N channel MOS transistor NL13 provided between sub word line WL0 and the ground potential, and having its gate potential controlled by the potential of internal node n21. Although not shown in FIG. 15, local decoder LWD includes a structure of receiving sub decode signals /¼SELECT0s1–3 instead of sub decode signal /¼SELECT0 to drive sub word lines WL1–WL3.

The remaining elements are similar to those of the structure shown in FIG. 14. Corresponding components have the same reference characters allotted, and description thereof will not be repeated.

The structure of FIG. 15 has advantages similar to those of the seventh embodiment shown in FIG. 14.

[Modification 2 of Seventh Embodiment]

Figure 16:
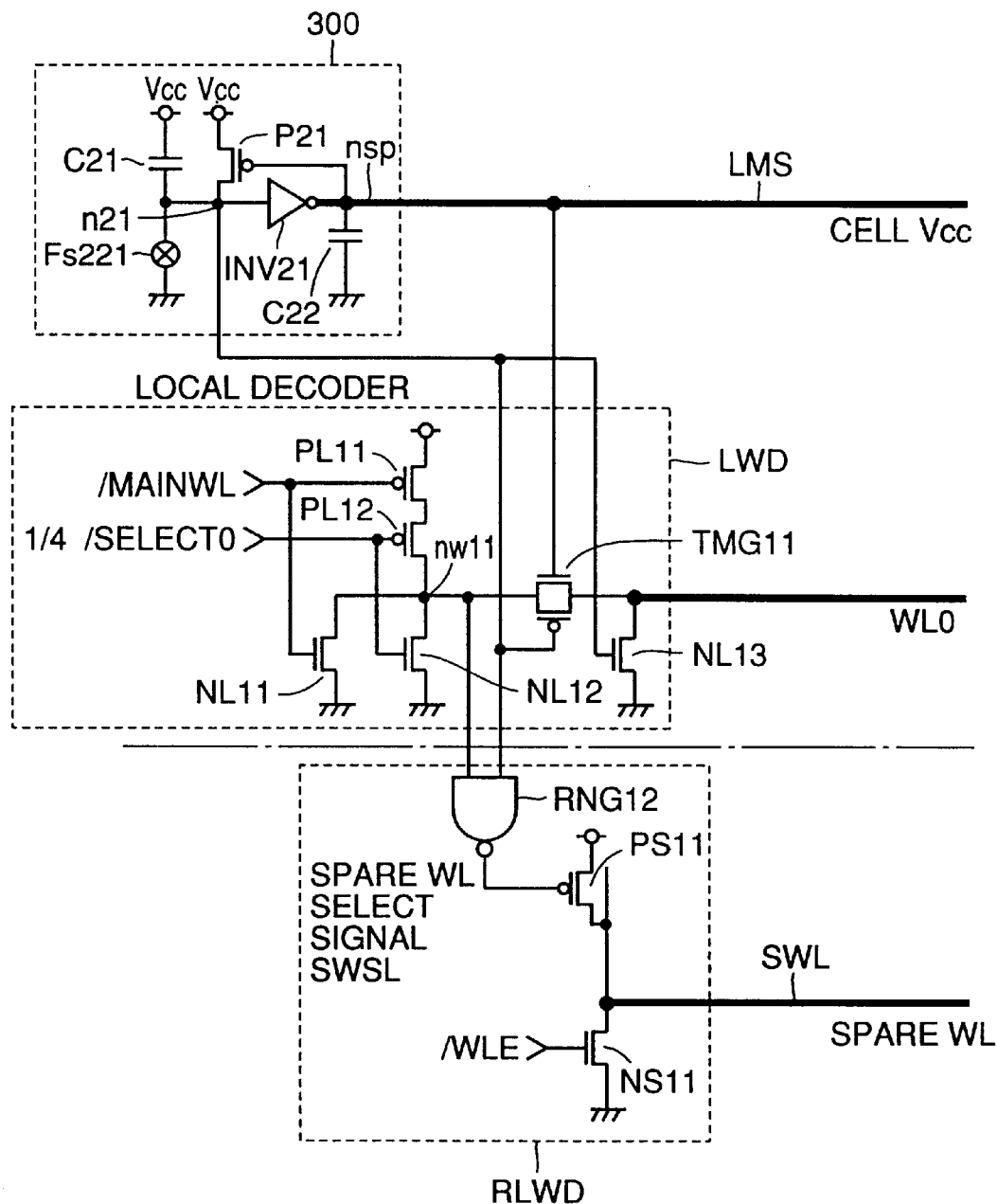

FIG. 16 is a schematic block diagram showing a second modification of the structure of the seventh embodiment shown in FIG. 14.

The structure of FIG. 16 differs from the structure of FIG. 14 in local decoder LWD and redundant local decoder RLWD.

Referring to FIG. 16, local decoder LWD includes a P channel MOS transistor PL11 having its gate potential controlled by signal /MAINWL, and having its source connected to power supply potential Vcc, a P channel MOS transistor PL12 provided between the drain of transistor PL11 and sub word line WL0, having its gate potential controlled by signal /¼SELECT0, an N channel MOS transistor NL13 provided between sub word line WL0 and the ground potential, and having its gate potential controlled by the potential of an internal node n21 of cell power supply set circuit 300, a transmission gate TMG11 provided between sub word line WL0 and an internal node nw11, under control of the potential of memory cell power supply line LMS and the potential of internal node n21, and rendered conductive when the potential of memory cell power supply line LMS is at an H level, an N channel MOS transistor NL11 provided between internal node nw11 and the ground potential, having its gate potential controlled by signal /MAINWL, and an N channel MOS transistor NL12 provided between internal node nw11 and the ground potential, and having its gate potential 25 controlled by sub decode signal /¼SELECT0. Although not shown in FIG. 16, local decoder LWD includes a structure in which sub decode signals /¼SELECT1–3 are received instead of sub decode signal /¼SELECT0 to drive sub word lines WL1–WL3.

Redundant row decoder RLWD to drive a spare word line SWL in redundancy replacement includes a NAND gate RNG12 receiving the potential of internal node n21 of cell power supply set circuit 300 and the potential of internal node nw11 of local decoder LWD to generate a spare word line select signal SWSL, a P channel MOS transistor PS11 provided between power supply potential Vcc and spare word line SWL, receiving signal SWSL at its gate, and an N channel MOS transistor NS11 provided between spare word line SWL and the ground potential, receiving signal /WLE that attains an L level in response to activation of redundant main word line RMWL at its gate.

In replacement of a redundant row, cut off of fuse element Fs221 in cell power supply set circuit 300 causes the potential of internal node n21 to be driven to an H level and signal /MAINWL and sub decode signal /¼SELECT0 selecting sub word line WL0 both attain an L level. As a result, the potential of internal node nw11 is driven to an H level, and signal SWSL attains an L level. Therefore, P channel MOS transistor PS11 is rendered conductive, and spare word line SWL is rendered active.

The remaining elements are similar to those of the structure shown in FIG. 14. Corresponding components have the same reference characters allotted, and description thereof will not be repeated.

The structure of FIG. 16 can provide advantages similar to those of the seventh embodiment shown in FIG. 14.

[Modification 3 of Seventh Embodiment]

Figure 17:
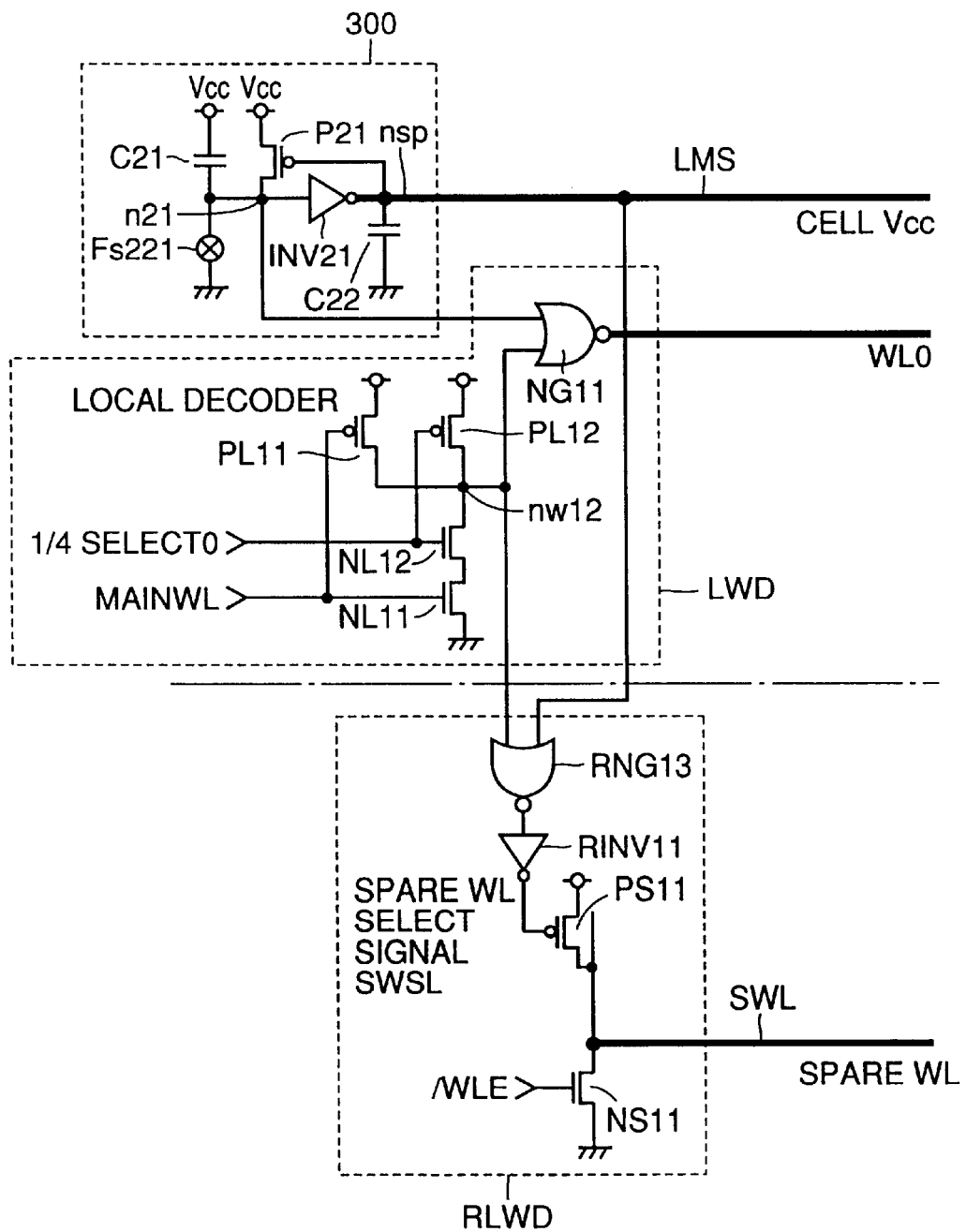

FIG. 17 is a schematic block diagram showing a third modification of the structure of the seventh embodiment shown in FIG. 14. The structure of the FIG. 17 differs from the structure of FIG. 14 in local decoder LWD and redundant local decoder RLWD.

Referring to FIG. 17, local decoder LWD includes a P channel MOS transistor PL11 responsive to activation of main word line MWL to have its gate potential controlled by signal MAINWL that attains an H level, having a source coupled with power supply potential Vcc, and a drain connected to internal node nw12, a P channel MOS transistor PL12 having its gate potential controlled by sub decode signal ¼SELECT0 that attains an H level in an active state, having a source coupled to power supply potential Vcc, and a drain connected to internal node nw12, an N channel MOS transistor NL11 having a source coupled to the ground potential, and having its gate potential controlled by signal MAINWL, an N channel MOS transistor NL12 provided between the drain of transistor NL11 and internal node nw12, having its gate potential controlled by sub decode signal ¼SELECT0, and an NOR gate NG11 receiving the potential of internal node n21 of cell power supply set circuit 300 and the potential of internal node nw12 of local decoder LWD, having an output node coupled to sub word line WL0. Although not shown in FIG. 14, local decoder LWD has a structure in which sub decode signals ¼SELECT1–3 are received instead of sub decode signal ¼SELECT0 to drive sub word lines WL1–WL3.

Redundant local decoder RLWD to drive spare word line SWL in redundancy replacement includes an NOR gate RNG13 receiving the potential of memory cell power supply line LMS and the potential of internal node NW12, an inverter RINV11 receiving and inverting the output of NOR gate RNG13 to generate a spare word select signal SWSL, a P channel MOS transistor PS11 provided between power supply potential Vcc and spare word line SWL, receiving signal SWSL at its gate, and an N channel MOS transistor NS11 provided between spare word line SWL and the ground potential, receiving a signal /WLE that attains an L level in response to activation of redundant main word line RMWL at its gate.

In replacement to a redundant row, disconnection of fuse element Fs21 in cell power supply set circuit 300 causes the potential of memory cell power supply line LMS to be driven to the ground potential and signal MAINWL and sub decode signal ¼SELECT0 selecting sub word line WL0 to attain an H level. As a result, the potential of internal node nw12 is driven to an L level, and signal SWSL attains an L level. As a result, P channel MOS transistor PS11 is rendered conductive, and spare word line SWL is rendered active.

The remaining elements are similar to those of the structure of FIG. 14. Corresponding components have the same reference characters allotted, and their description will not be repeated.

The structure of FIG. 17 provides advantages similar to those of the seventh embodiment shown in FIG. 14.

[Modification 4 of Seventh Embodiment]

Figure 18:
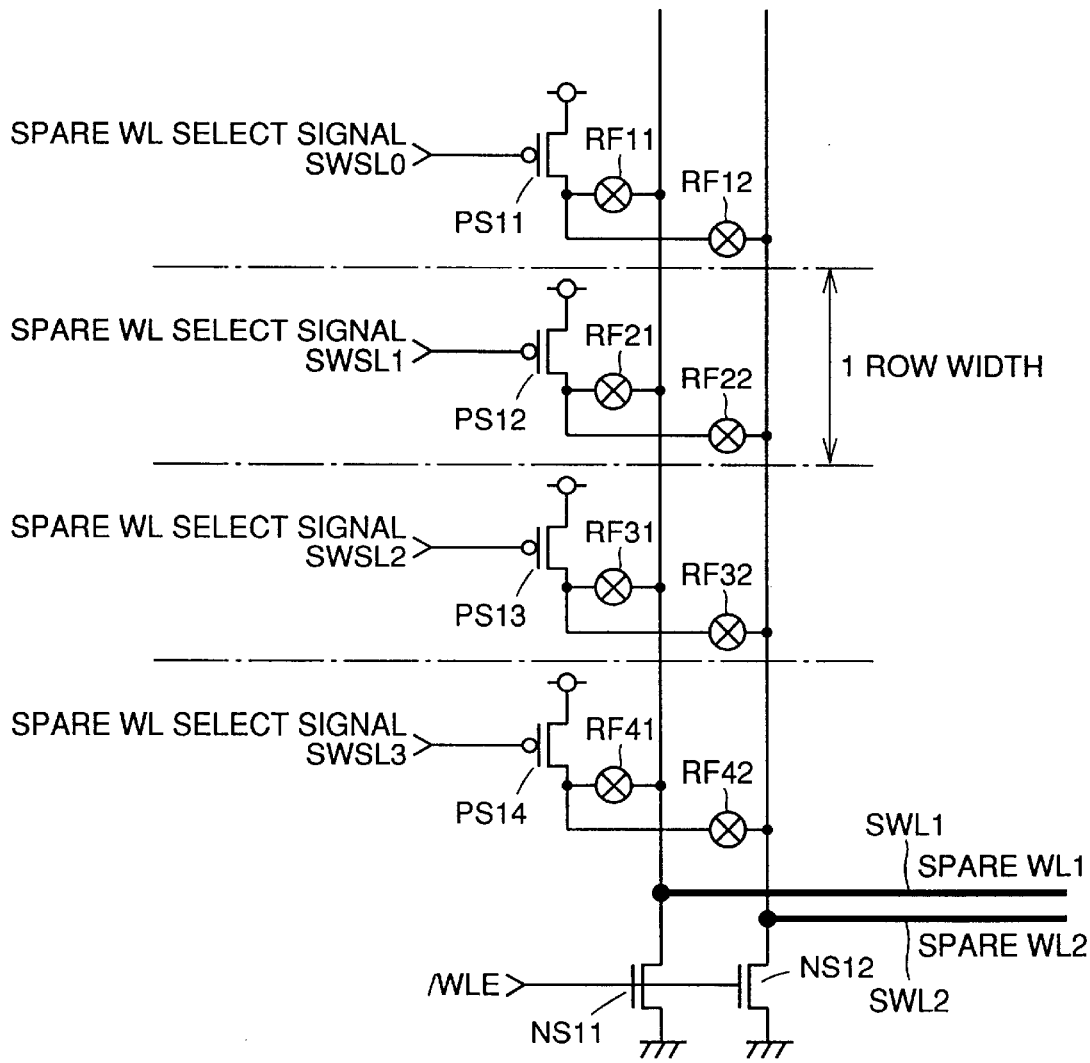
FIG. 18 is a circuit diagram showing a modification of the portion receiving a spare word line select signal and driving a spare word line in a redundant local decoder RLWD.

FIG. 18 is a circuit diagram showing a modification of the potential that receives a spare word line select signal at redundant local decoder RLWD to drive a spare word line when there are a plurality of spare word lines.

In the case where there are a plurality of spare word lines, a structure is implemented in which fuse elements RF11–RF42 to determine which spare word line is to be selected as in FIG. 18 are provided, and the fuse element connected to the spare word line that is not required is decoupled among the fuses of the replaced row.

More specifically, in a structure in which spare word line select signals SWSL0–SWSL3 are generated corresponding to the signal from different local decoders LWD, fuse element RF11 is left and fuse element RF12 is decoupled, for example, when spare word line SWL1 corresponding to signal SWSL0 is to be selected.

[Eighth Embodiment]

An SRAM of an eighth embodiment is directed to a structure in which the fuse element that sets memory cell power supply line LMS to the ground level (the fuse element that sets memory cell ground line LMG to the level of power supply potential Vcc) is used as the fuse element to specify a redundancy replacement address when redundancy replacement is carried out for every plurality of rows.

Similar to the SRAM of the seventh embodiment shown in FIG. 13, the SRAM of the eighth embodiment has the structure of a row decoder that carries out row selection and a word line taking the so-called divisional word line system.

Figure 19:
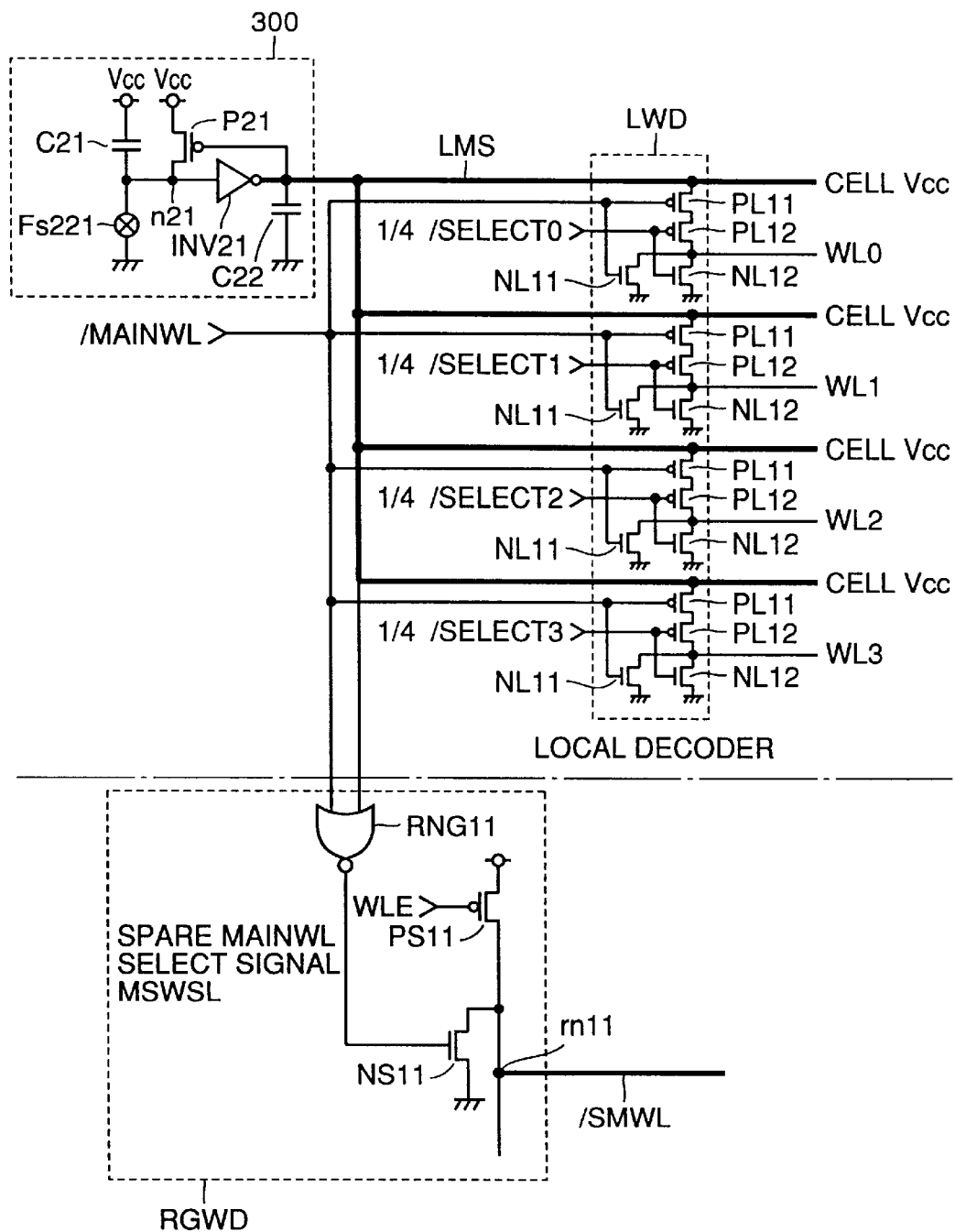
FIG. 19 is a block diagram of an extraction of a structure of a redundant global decoder RGWD.

FIG. 19 is a block diagram showing a local decoder LWD driving sub word lines WL0–WL3 and a redundant global decoder RGWD that generates a signal /SMWL to drive a redundant main word line RMWD corresponding to a plurality of redundant rows that are to be replaced when there is a defect in memory cell MC connected to sub word lines WL0–WL3. Redundant global decoder RGWD is included in main row decoder 109a in FIG. 13.

Referring to FIG. 19, power supply potential Vcc from cell power supply set circuit 300 is supplied through memory cell power supply line LMS to the regular memory cell MC and the N well thereof. Also, power supply potential Vcc is supplied through redundant cell memory cell power supply line RLMS (not shown) to redundant memory cell RMS and the N well thereof.

In carrying out redundancy replacement, fuse element Fs221 in cell power supply set circuit 300 is decoupled, and the potential of memory cell power supply line LMS is fixed to the level of the ground potential.

Local decoder LWD includes a P channel MOS transistor PL11 having its gate potential controlled by signal /MAINWL that attains an L level in response to activation of main word line MWL, having a source connected to memory cell power supply line LMS, a P channel MOS transistor PL12 provided between the drain of transistor PL11 and sub word line WL0, having its gate potential controlled by sub decode signal /¼SELECT0 that attains an L level in an active state, an N channel MOS transistor NL11 provided between sub word line WL0 and the ground potential, having its gate potential controlled by signal /MAINWL, and an N channel MOS transistor NL12 provided between sub word line WL0 and the ground potential, and having its gate potential controlled by sub decode signal /¼SELECT0. Local decoder LWD further includes the structure in which sub decode signals /¼SELECT1–3 are received instead of sub decode signal /¼SELECT0 to drive sub word lines WL1–WL3.

Redundant global decoder RGWD includes an NOR gate RNG11 receiving the potential of memory cell power supply line LMS and signal /MAINWL to generate a spare main word line select signal MSWSL, a P channel MOS transistor PS11 provided between a node rn11 from which signal /SMWL is output and power supply potential Vcc, receiving signal WLE that attains an H level when redundant main word line RMWL is rendered active at its gate, and an N channel MOS transistor NS11 provided between node rn11 and the ground potential, receiving signal MSWSL at its gate.

In replacement to a redundant row, disconnection of fuse element Fs221 in cell power supply set circuit 300 causes the potential of memory cell power supply line LMS to be driven to the ground potential and signal /MAINWL selecting sub word line WL0 to attain an L level. As a result, signal MSWSL is driven to an H level, and N channel MOS transistor NS11 is rendered conductive, whereby signal /SMWL attains an L level.

In contrast to the first to sixth embodiments in which a new fuse element for the memory cell power supply line is required in addition to the fuse element to specify a redundancy replacement address, the structure of the FIG. 19 allows fuse element Fs221 that drives the memory cell power supply line to the ground level to be also used as the fuse element to specify the redundancy replacement address. Therefore, increase of the layout area can be suppressed.

By decoupling the fuse element that drives the memory cell power supply line to the ground level, the regular main word line will not be rendered active even if a select signal for the regular main word line arrives. The redundant main word line is rendered active instead. Accordingly, the fuse for memory cell redundancy replacement and the program circuit can be omitted. Thus, the layout area can be reduced.

The above structure has been described in which the fuse element to set the memory cell power supply line to the ground level is used in common as the fuse element to specify a redundancy replacement address in the row redundancy replacement for every plurality of rows. However, a structure is allowed in which a fuse element driving a memory cell ground line to the level of power supply potential Vcc is used in common as a fuse element to specify a redundancy replacement address where row redundancy replacement is carried out for every plurality of rows.

In the case where the fuse element that drives the memory cell ground line to the level of power supply potential Vcc as the fuse element for memory cell redundancy replacement, the portion of cell power supply set circuit 300 out of the circuitry of FIG. 19 is modified to cell ground set circuit 310 as shown in FIG. 10 and the potential of the input node of inverter INV31 is applied instead of the potential of memory cell power supply line LMS as the input signal to logic circuit RNG11.

In the case where the fuse element that drives the memory cell power supply line to the level of ground is employed for only the fuse element to set the defective row to a nonselected state and a fuse element for spare row selection is provided individually, redundant global decoder RGWD of FIG. 19 is no longer required.

[Modification 1 of Eighth Embodiment]

Figure 20:
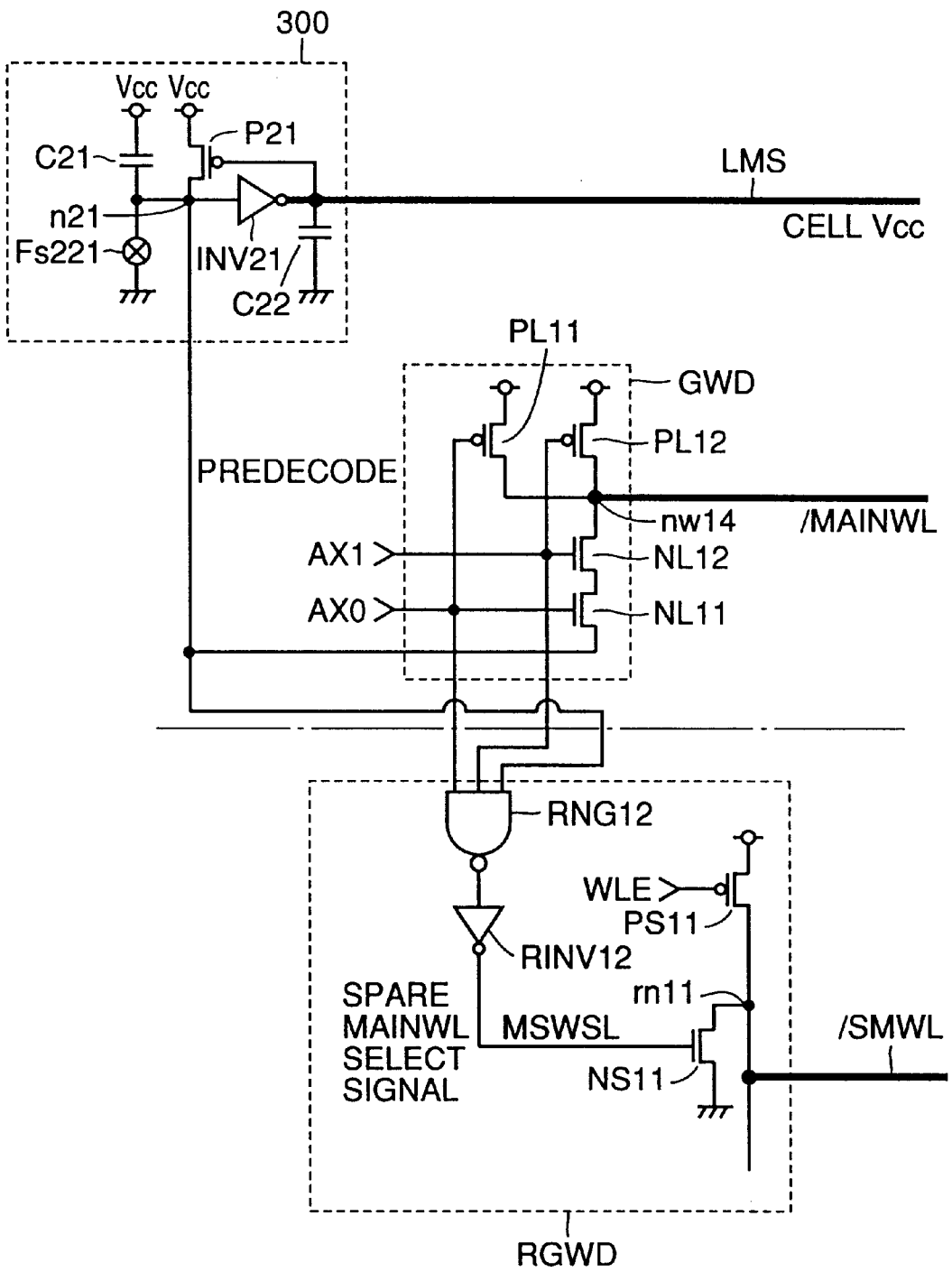
FIGS. 20, 21, 22 and 23 are schematic block diagrams showing first, second, third and fourth modifications, respectively, of a structure according to the eighth embodiment shown in FIG. 19.

FIG. 20 is a schematic block diagram showing a first modification of the structure of the eighth embodiment shown in FIG. 19.

The structure of FIG. 20 differs from the structure of FIG. 19 in that the decoder that generates a signal to redundant global decoder RGWD is global decoder GWD in main row decoder 109a instead of local decoder LWD, and also in the structure of redundant global decoder RGWD.

Referring to FIG. 20, global decoder GWD includes a P channel MOS transistor PL11 having its gate potential controlled by a signal AX0 in the predecode signal, and having a source connected to power supply potential Vcc and a drain connected to an internal node nw14, a P channel MOS transistor PL12 having its gate potential controlled by a signal AX1 in the predecode signal, a source coupled with power supply potential Vcc, and a drain connected to internal node nw14, an N channel MOS transistor NL11 having a source coupled with an internal node n21 in cell power supply set circuit 300, and having its gate potential controlled by signal AX0, and an N channel MOS transistor NL12 provided between the drain of transistor NL11 and internal node nw14, and having its gate potential controlled by signal AX1. A signal /MAINWL to drive the main word line is output from internal node nw14. Although not shown in FIG. 20, main row decoder 109a includes the structure to drive another main word line according to a combination of other predecode signals.

Redundant global decoder RGWD further includes a NAND gate RNG12 receiving the potential level of internal node n21 in cell power supply set circuit 300 and signals AX0 and AX1, an inverter RINV12 receiving the output of NAND gate RNG12 to generate a spare main word line select signal MSWSL, a P channel MOS transistor PS11 provided between a node rn11 that outputs signal /SMWL and power supply potential Vcc, receiving at its gate a signal WLE that attains an H level in rendering redundant main word line RMWL active, and an N channel MOS transistor NS11 provided between node rn11 and the ground potential, and receiving signal MSWSL at its gate.

More specifically, when fuse element Fs221 in cell power supply set circuit 300 is decoupled in replacement of a redundant row, internal node n21 attaining an H level and predecode signals AX0 and AX1 to select a main word line both attaining an H level causes signal MSWSL to be driven to an H level. N channel MOS transistor NS11 is rendered conductive, and signal /SMWL attains an L level.

The remaining elements are similar to those of the structure shown in FIG. 19. Corresponding components have the same reference characters allotted, and description thereof will not be repeated.

The structure of FIG. 20 provides advantages similar to those of the eighth embodiment of FIG. 19.

In column redundancy using a column select signal of L enable, application to column redundancy for every plurality of columns is allowed by taking the signal that selects the main word line described above as a column select signal.

[Modification 2 of Eighth Embodiment]

Figure 21:
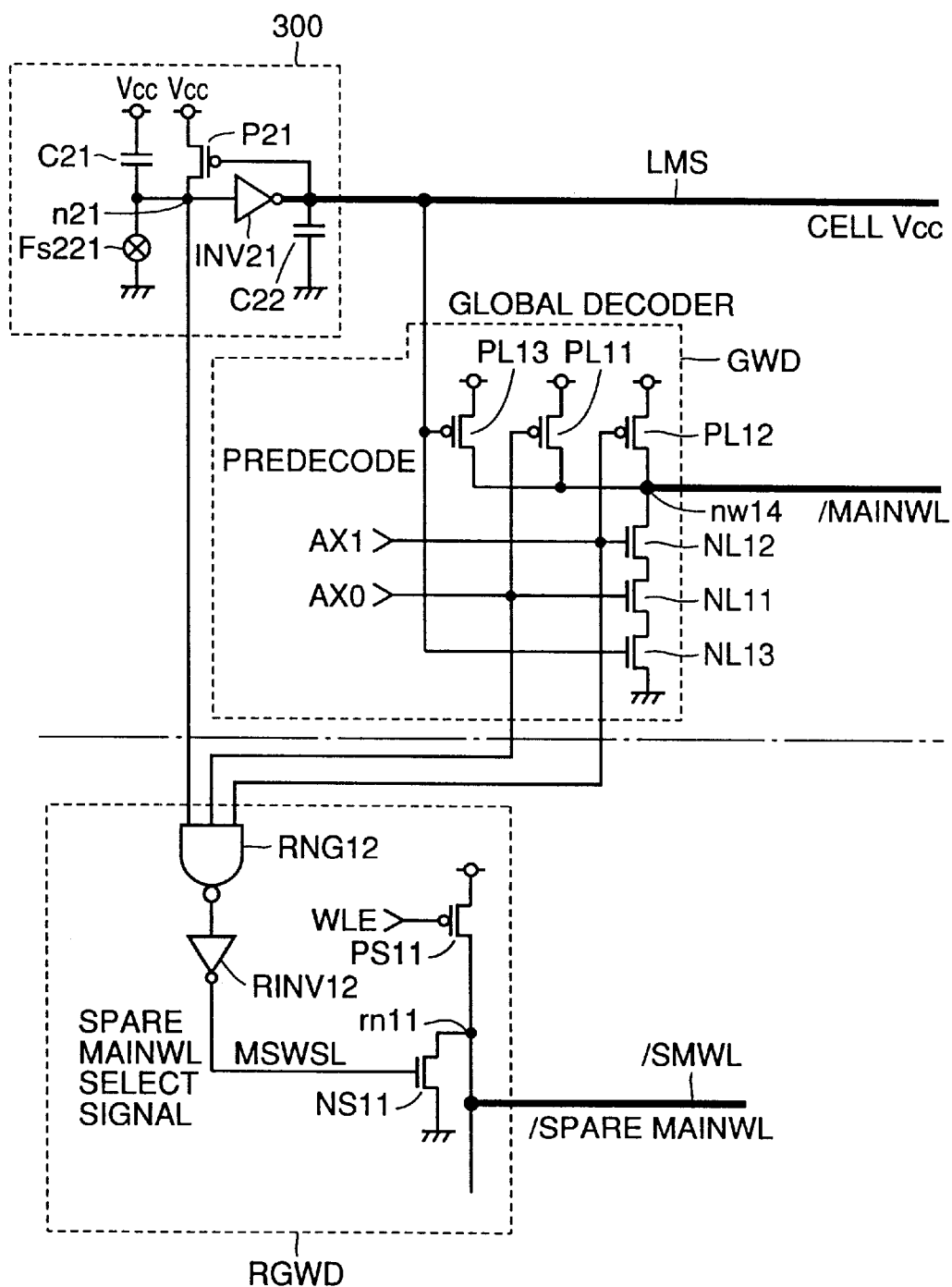

FIG. 21 is a schematic block diagram showing a second modification of the structure of the eighth embodiment shown in FIG. 19.

The structure of FIG. 21 differs from the structure of FIG. 19 in that the decoder that generates a signal to redundant global decoder RGWD is global decoder GWD in main row decoder 109a instead of local decoder LWD.

Referring to FIG. 21, global decoder GWD includes a P channel MOS transistor PL13 receiving the potential of memory cell power supply line LMS at its gate, having its source connected to power supply potential Vcc, and a drain connected to internal node nw14, a P channel MOS transistor PL11 having its gate potential controlled by signal AX0 out of the predecode signal, having its source coupled to power supply potential Vcc, and its drain connected to internal node nw14, a P channel MOS transistor PL12 having its gate potential controlled by signal AX1 in the predecode signal, and having its source coupled to power supply potential Vcc, and its drain connected to internal node nw14, an N channel MOS transistor NL13 receiving the potential of memory cell power supply line LMS at its gate, and having its source coupled to ground potential GND, an N channel MOS transistor NL11 having its source coupled to the drain of transistor NL13, and its gate potential controlled by signal AX0, and an N channel MOS transistor NL12 provided between the drain of transistor NL11 and internal node nw14, and having its gate potential controlled by signal AX1. A signal /MAINWL to drive the main word line is output from internal node nw14. Although not shown in FIG. 21, main row decoder 109 includes the structure to drive another main word line according to a combination of other predecode signals.

Redundant global decoder RGWD includes a NAND gate RNG12 receiving the potential of internal node n21 in cell power supply set circuit 300 and signals AX0 and AX1, an inverter RINV12 receiving the output of NAND gate RNG12 to generate a spare main word line select signal MSWSL, a P channel MOS transistor PS11 provided between node rn11 from which signal /SMWL is output and power supply potential Vcc, receiving at its gate a signal WLE that attains an H level when redundant main word line RMWL is rendered active, and an N channel MOS transistor NS11 provided between node rn11 and the ground potential, and receiving signal MSWSL at its gate.

When fuse element Fs221 is decoupled in cell power supply set circuit 300 when replacement to the redundant row is carried out, internal node n21 attaining an H level and predecode signals AX0 and AX1 to select a main word line both attaining an H level cause signal MSWSL to be driven to an L level. N channel MOS transistor NS11 is rendered conductive, and signal /SMWL attains an L level.

The remaining elements are similar to those of the structure shown in FIG. 19. Corresponding components have the same reference characters allotted, and description thereof will not be repeated.

The structure of FIG. 21 provides advantages identical to those of the eighth embodiment shown in FIG. 19.

By taking the signal that selects a main word line described above as a column select signal in column redundancy employing a column select signal of L enable, application to column redundancy is allowed.

[Modification 3 of Eighth Embodiment]

Figure 22:
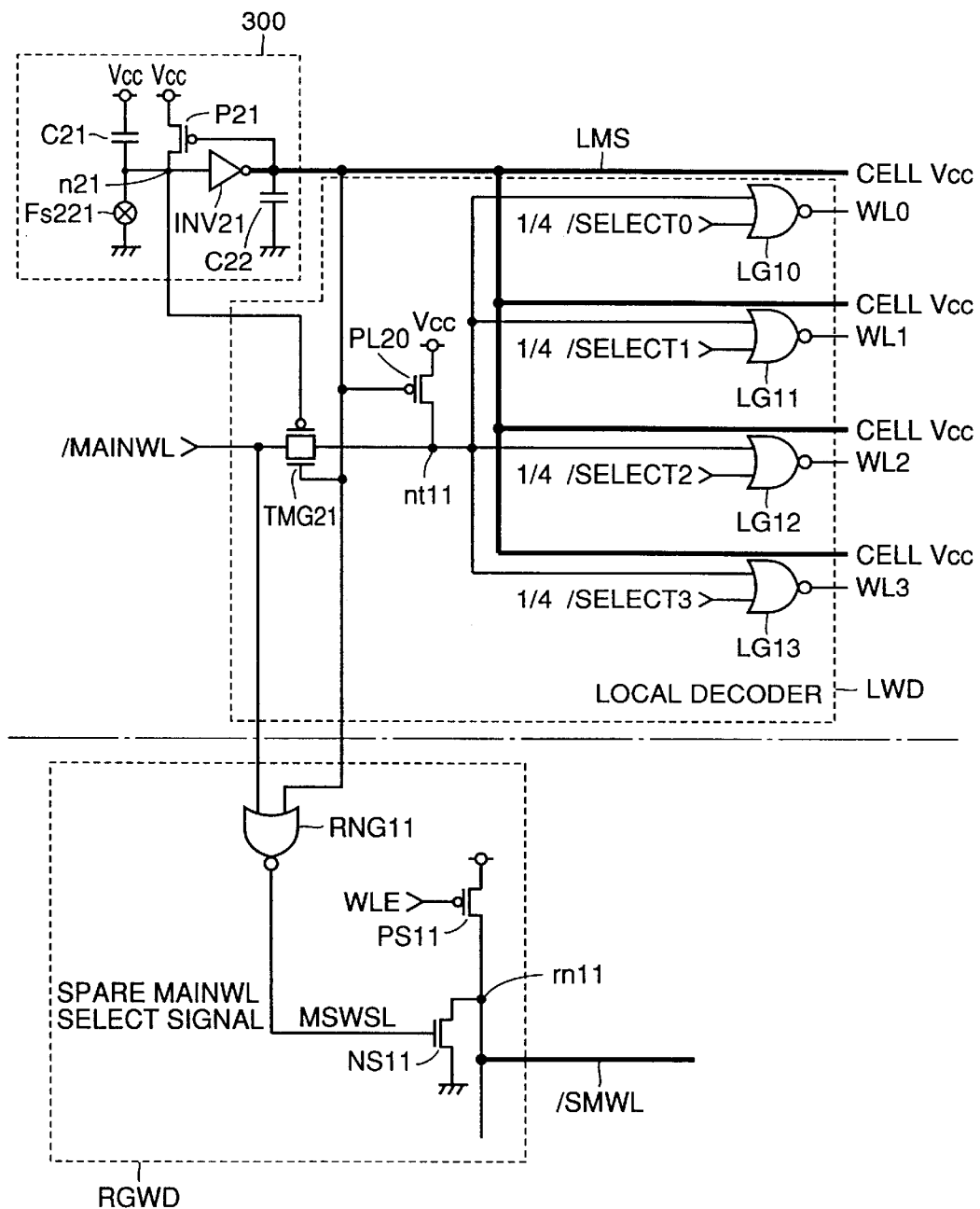

FIG. 22 is a schematic block diagram showing a modification 3 of the eighth embodiment of FIG. 19.

The structure of FIG. 22 differs from the structure of FIG. 19 in the structure of local decoder LWD.

Referring to FIG. 22, local decoder LWD includes a transmission gate TMG21 responsive to activation of main word line MWL to receive a signal /MAINWL that attains an L level, and attaining a conductive state when the potential of internal node n21 in cell power supply set circuit 300 is at an L level, a P channel MOS transistor PL20 provided between output node nt11 of transmission gate TMG21 and power supply potential Vcc, receiving the potential of cell power supply line LMS at its gate, a NOR gate LG10 receiving a sub decode signal /¼SELECT0 that attains an L level in an active state and the potential of output node nt11 to drive the potential of sub word line WL0, a NOR gate LG11 receiving a sub decode signal /¼SELECT1 that attains an L level in an active state and the potential of output node nt11 to drive the potential of sub word line WL1, a NOR gate LG12 receiving sub decode signal/ ¼SELECT2 that attains an L level in an active state and the potential of output node nt11 to drive the potential of sub word line WL2, and a NOR gate LG13 receiving sub decode signal /¼SELECT3 attaining an L level in an active state and the potential of output node nt11 to drive the potential of sub word line WL3.

The structure of redundant global decoder RGWD is analogous to the structure of FIG. 19. Therefore, description thereof will not be repeated.

When fuse element Fs221 is decoupled in cell power supply set circuit 300 when redundancy with a redundant row is carried out, the potential of memory cell power supply line LMS attains the ground potential, and the potential of node n21 attains an H level. Therefore, transmission gate TMG21 attains a cut off state. Furthermore, if signal /MAINWL, for example, to select sub word line WL0 attains an L level, signal MSWSL is driven to an H level. N channel MOS transistor NS11 is rendered conductive, and signal /SMWL attains an L level.

By taking the signal that selects a main word line described above as a column select signal in column redundancy using a column select signal of L enable, application to column redundancy is allowed.

[Modification 4 of Eighth Embodiment]

Figure 23:
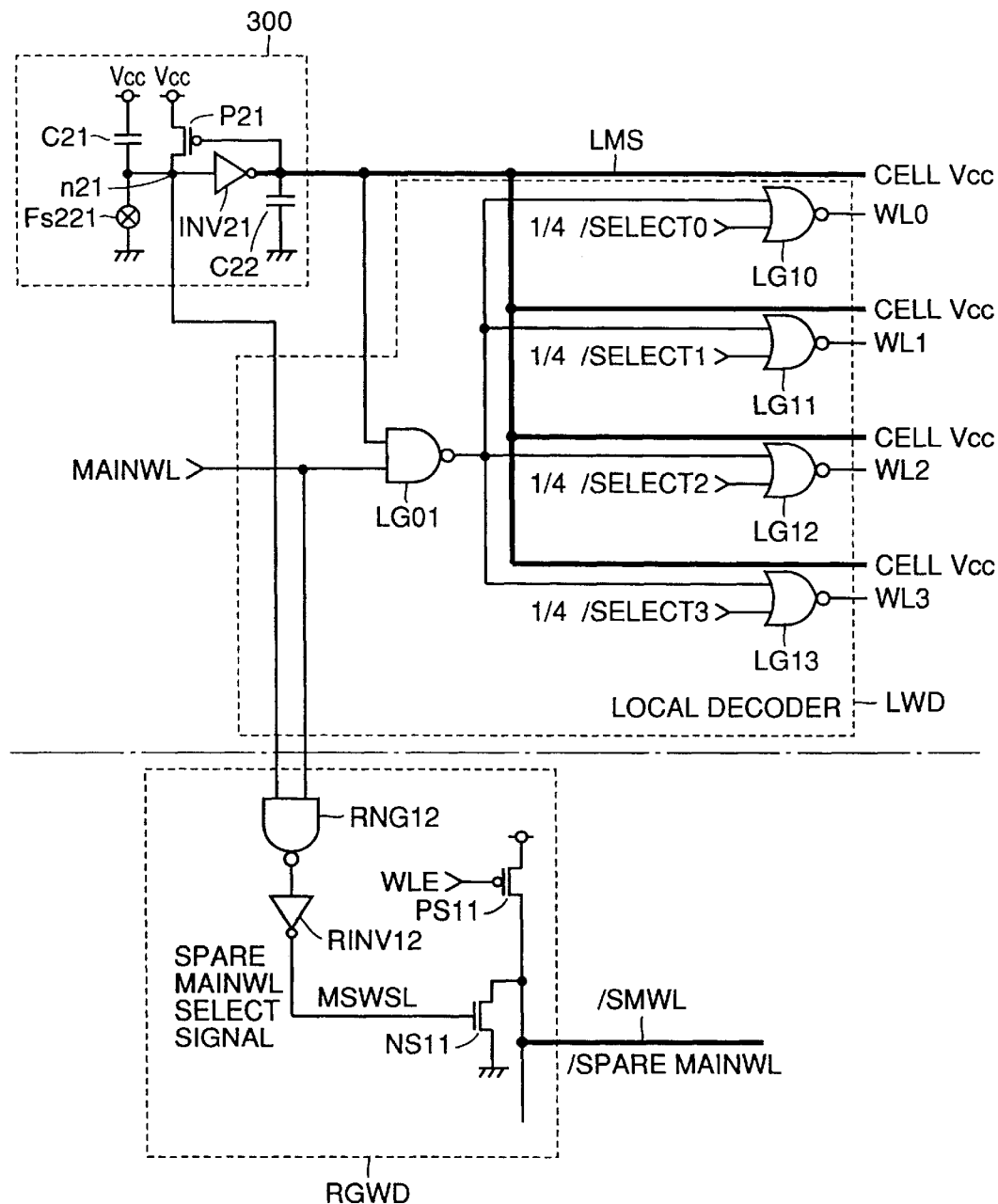

FIG. 23 is a schematic block diagram showing a modification 4 of the structure of the eighth embodiment shown in FIG. 19.

The structure of the FIG. 23 differs from the structure of FIG. 19 in the structure of local decoder LWD and redundant global decoder RGWD.

Referring to FIG. 23, local decoder LWD includes a NAND gate LG01 responsive to activation of main word line MWL to receive a signal MAINWL that attains an H level and the potential of cell power supply line LMS, a NOR gate LG10 receiving a sub decode signal /¼SELECT0 that attains an L level in an active state and the output of NAND gate LG01 to drive the potential of sub word line WL0, a NOR gate LG11 receiving a sub decode signal /¼SELECT1 that attains an L level in an active state and the output of NAND gate LG01 to drive the potential of sub word line WL1, a NOR gate LG12 receiving sub decode signal /¼SELECT2 that attains an L level in an active state and the output of NAND gate LG01 to drive the potential of sub word line WL2, and a NOR gate LG13 receiving sub decode signal /¼SELECT3 that attains an L level in an active state and the output of NAND gate LG01 to drive the potential of sub word line WL3.

Redundant global decoder RGWD includes a NAND gate RNG12 receiving the potential level of internal node n21 in cell power supply set circuit 300 and signal MAINWL, an inverter RINV12 receiving the output of NAND gate RNG12 to generate a spare main word line select signal MSWSL, a P channel MOS transistor PS11 provided between node rn11 from which signal /SMWL is output and power supply potential, receiving at its gate a signal WLE that attains an H level when redundant main word line RMWL is rendered active, and an N channel MOS transistor NS11 provided between node rn11 and the ground potential, receiving signal MSWSL at its gate.

When fuse element Fs221 in cell power supply set circuit 300 is decoupled in redundancy with a redundant row, the potential level of memory cell power supply line LMS is set to the ground potential, and the potential of node n21 attains an H level. Therefore, when signal MAINWL, for example, to select sub word line WL0 attains an H level, signal MSWSL is driven to an H level. N channel MOS transistor NS11 is rendered conductive, and signal /SMWL attains an L level.

By taking the signal that selects a main word line described above as a column select signal in column redundancy using a column select signal of L enable, application to column redundancy is allowed.

[Modification 5 of Eighth Embodiment]

Figure 24:
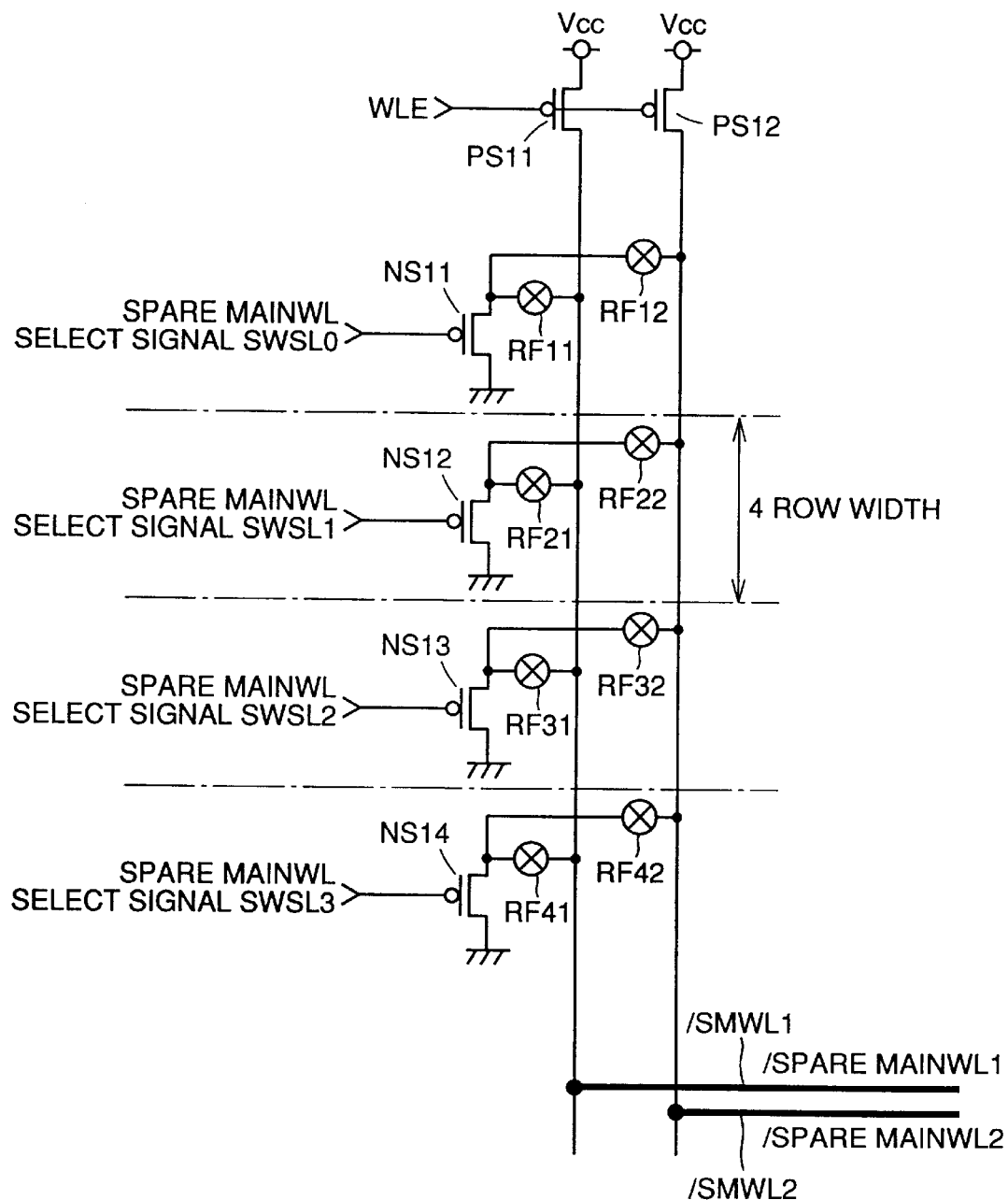
FIG. 24 is a circuit diagram showing a modification of the portion receiving a spare main word line select signal to drive a spare main word line.

FIG. 24 is a circuit diagram showing a modification of the portion that receives a spare main word line select signal at redundant global decoder RGWD to drive a spare main word line.

When there are a plurality of spare word lines, fuse elements RF11–RF42 to determine which of the spare main word lines is to be selected as shown in FIG. 24 are provided, wherein the fuse element connected to the spare main word line that is not required among the fuses of the replaced row is decoupled.

More specifically, in a structure where corresponding spare word line select signals SWSL0–SWSL3 are generated according to a signal from a different local decoder LWT or global decoder GWD, fuse element RF11 is left and fuse element RF12 is decoupled, for example, when specification is desired to render signal /SMWL1 active to select spare main word line SWSL1 in response to signal SWSL0.

Ninth Embodiment

An SRAM according to a ninth embodiment of the present invention has a structure in which row redundancy replacement for every one row is allowed uses the fuse element specifying the address for redundancy replacement also as a fuse element that drives the memory cell power supply line to the ground level (or fuse element that drives the memory cell ground line to the power supply level).

As will become clear from the following description, in column redundancy employing a column select signal of H enable in a structure where column redundancy replacement for every one column is allowed, the fuse element that specifies an address for redundancy replacement can be also used as the fuse element that drives the memory cell power supply line to the ground level (or as the fuse element that drives the memory cell ground line to the power supply level).

Differing from the above-described first to eighth embodiments, the structure of the fuse element that specifies an address for redundancy replacement can suppress the consumed current in a standby state and reduce the fuse area by employing the structure of the well-known memory cell redundancy replacement fuse to carry out the switching operation of the memory cell power supply.

Figure 25:
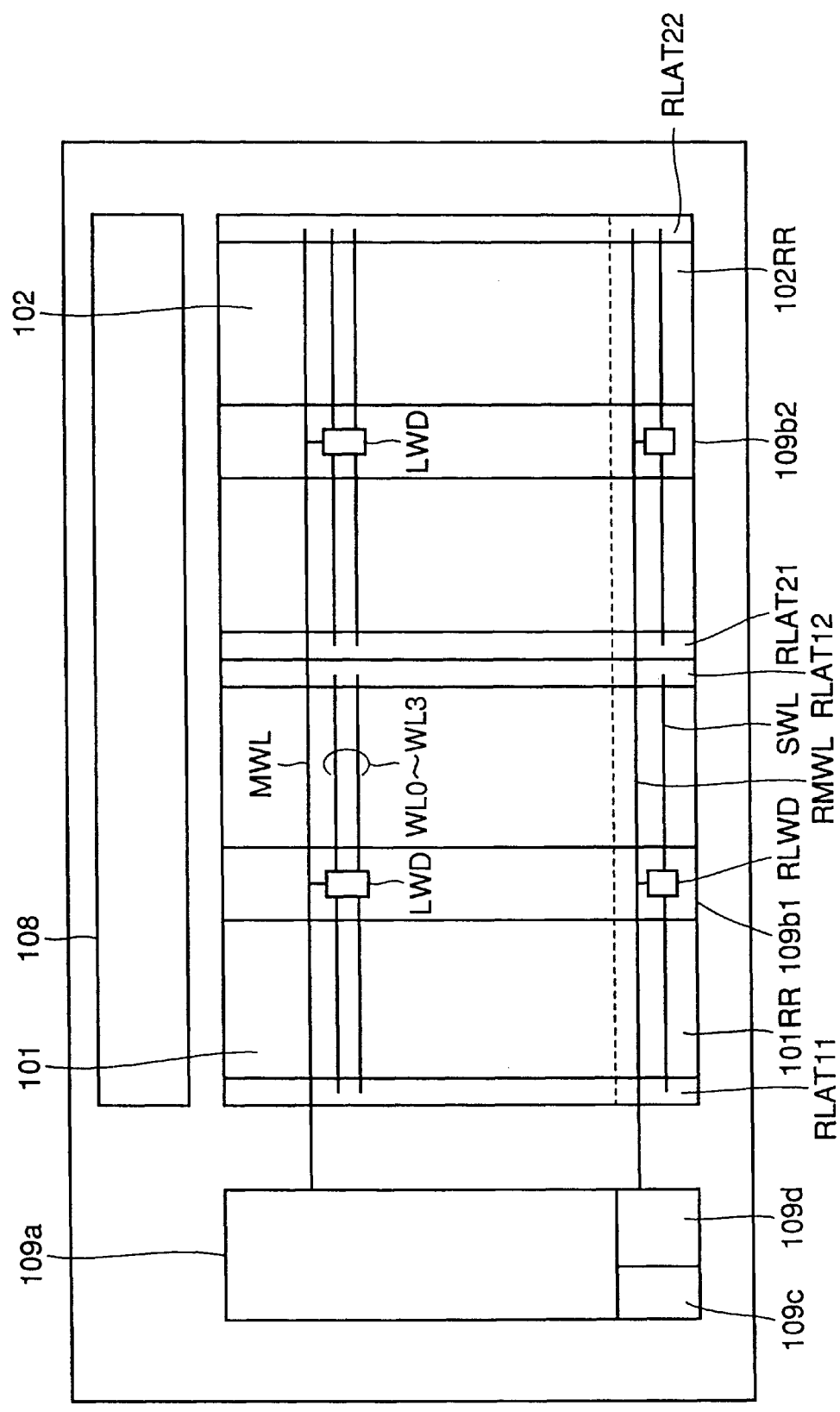
FIG. 25 is a schematic block diagram to describe an example of a structure of a memory cell array, a row decoder and a column decoder according to a ninth embodiment of the present invention.

FIG. 25 is a schematic block diagram showing a example of a structure of the memory cell array, the row decoder and the column decoder of the ninth embodiment, corresponding to FIG. 13.

In the SRAM of the ninth embodiment shown in FIG. 25, the row decoder that carries out row selection and also the word line take the so-called divisional word line system. However, the present invention according to the ninth embodiment is not limited to such a structure, and is applicable to a structure other than the divisional word line system.

More specifically, row decoder 109 includes a main row decoder 109a to selectively drive a main word line MWL, and local decoder units 109b1 and 109b2 provided corresponding to memory cell arrays 101 and 102, respectively, to drive a sub word line.

Corresponding to one main word line MWL, a local decoder LWD is provided for each of local decoder units 109b1 and 109b2. Local decoder LWD selectively renders any one of sub word lines WL0–WL3 active by sub decode signals ¼SELECT0–3.

Similar to the structure of FIG. 1, a redundant memory cell row 101RR is provided corresponding to memory block 101 to carry out repairment by redundancy replacement when there is a defect in the memory cell in memory block 101. Also, a redundant memory cell row 102RR is provided corresponding to memory block 102 to carry out repairment by redundancy replacement when there is a defective memory cell in memory block 102.

Redundant memory cell rows 101RR and 102RR have a local decoder RLWD provided for each of local decoder units 109b1 and 109b2 corresponding to one redundant main word line RMDL. Local decoder RLWD selectively renders spare word line SWL active.

Furthermore are provided a redundancy determination circuit 109c that stores in a nonvolatile manner a defective row address for redundancy replacement by a fuse element to compare an externally applied address signal with the defective row address, and a redundant decoder 109d to select a redundant row according to the determination result of redundancy determination circuit 109c.

According to the structure of FIG. 25, level retain circuits RLAT11, RLAT12, RLAT21 and RLAT22 to control the potential supplied to memory cell power supply line LMS are provided instead of cell power supply set circuit 300 provided to control the potential supplied to memory cell power supply line LMS in FIG. 13.

The memory cell power supply line or memory cell ground line is provided for every row.

Figure 26:
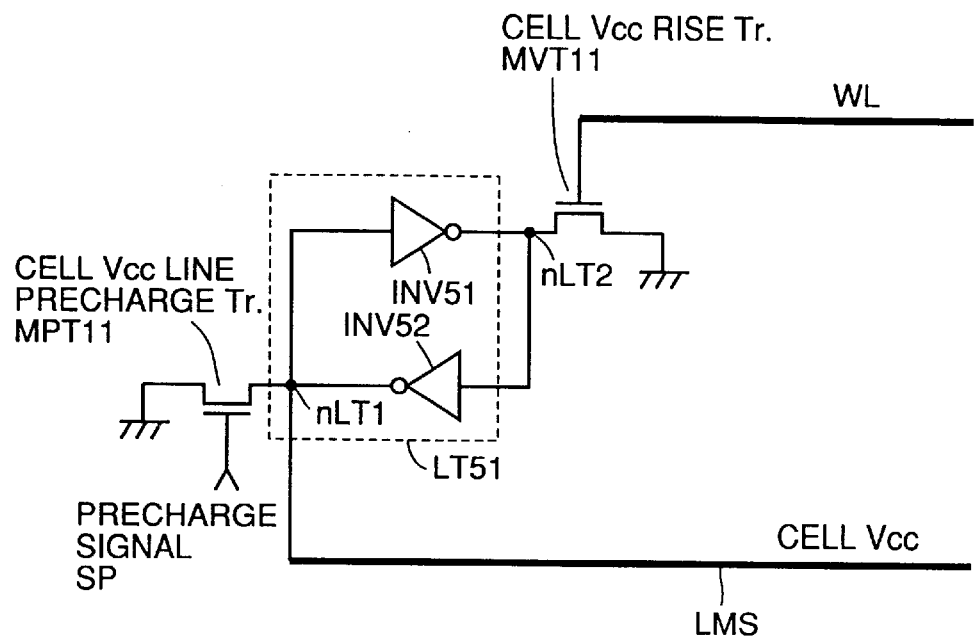
FIG. 26 is a circuit diagram to describe a structure of a row latch circuit 2000 provided for each row.

FIG. 26 is a circuit diagram to describe the structure of row latch circuit 2000 provided for each row in the circuit shown in level retain circuit RLAT11 of FIG. 25.

A precharge signal SP of an H level is applied to the gate of memory cell power supply line precharge transistor MPT11 which is an N channel MOS transistor under control of control circuit 104 to set all the memory cell power supply lines to the level of ground potential in the memory cell array, immediately following power on, whereby the ground level is written into a node nLT1 of latch circuit LT51 formed of inverters INV51 and INV52.

By applying a signal SP of an L level to the gate of memory cell power supply line precharge transistor MPT11, latch circuit LT51 attains a retain state.

When the memory cell is to be first accessed (generally, a write operation) following the power on, the rise of word line WL to an H level causes transistor MVT11 to be rendered conductive. The level of power supply potential Vcc is written into node nLT1 of latch circuit LT51, and memory cell power supply line LMS coupled with node nLT1 is set to the power supply level (Vcc level).

Since, the row (word line) that is subjected to redundancy replacement due to a defective memory cell will not be accessed, memory cell power supply line LMS corresponding to the row with the defective memory cell is still precharged at the ground level.

Accordingly, the fuse element provided in redundancy determination circuit 109*c* to specify a redundancy replacement address causes only the memory cell power supply line that has an unprogrammed address to attain the level of power supply potential Vcc. The memory cell power supply line of the memory cell row that was subjected to redundancy replacement and not used due to the defect attains the ground level.

Even if the device attains the standby state, the data of latch circuit LT51 is retained and the memory cell power supply line corresponding to the memory cell row subjected to redundancy replacement is at the ground level. Therefore, no standby current flows.

During the rise of the power, the memory cell power supply line of the used row remains at the level of power supply potential by implementing a structure in which control circuit 104 will not input a signal SP of an H level to the gate of memory cell power supply line precharge transistor MPT11.

By employing circuitry 2000 as shown in FIG. 26 according to the above-described structure, it is no longer necessary to provide a new fuse that occupies the layout area for the purpose of driving the memory cell power supply line to the ground level in addition to the conventional fuse for memory cell redundancy replacement.

[Modification 1 of Ninth Embodiment]

Figure 27:
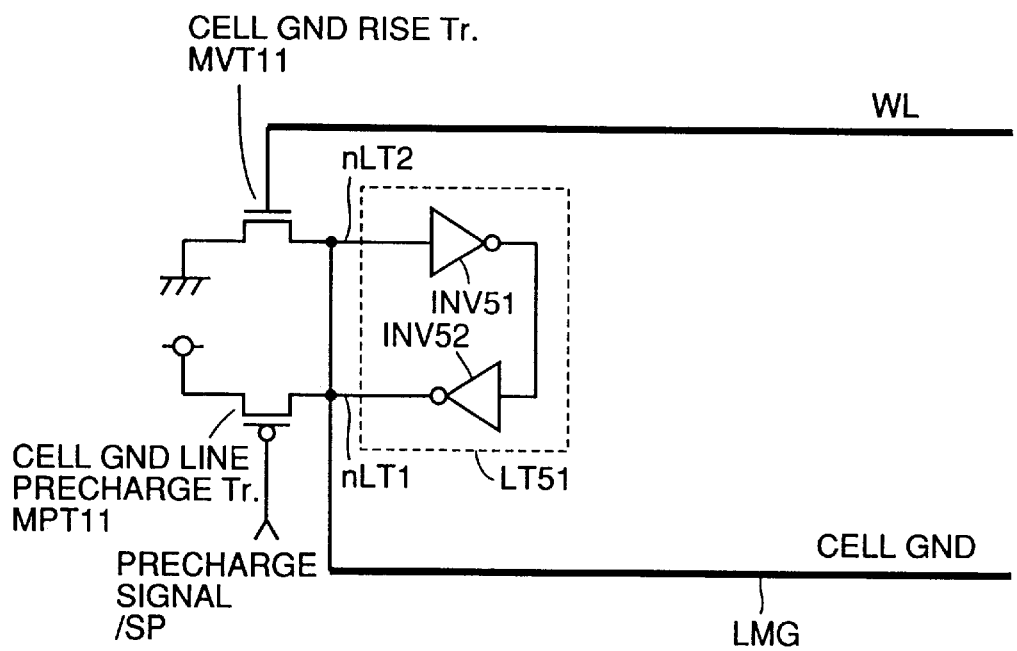
FIGS. 27, 28, 29, 30, 31, 32, and 33 are circuit diagrams to describe a structure of row latch circuits 2002, 2004, 2006, 2100, 2102, 2104 and 2106, respectively.

FIG. 27 is a circuit diagram to describe the structure of a row latch circuit 2002 provided for each row, which is a modification of row latch circuit 2000 of FIG. 26.

In contrast to the structure of FIG. 26, the gate potential of memory cell ground line precharge transistor MPT11 of the P channel MOS transistor is controlled by a signal /SP corresponding to precharge signal SP with the polarity inverted. Memory cell ground line LMG is connected to node nLT1 of latch circuit LT51.

The remaining elements are similar to those of row latch circuit 2000 of FIG. 26, provided that the polarity of the potential is opposite. Therefore, description thereof will not be repeated.

[Modification 2 of Ninth embodiment]

Figure 28:
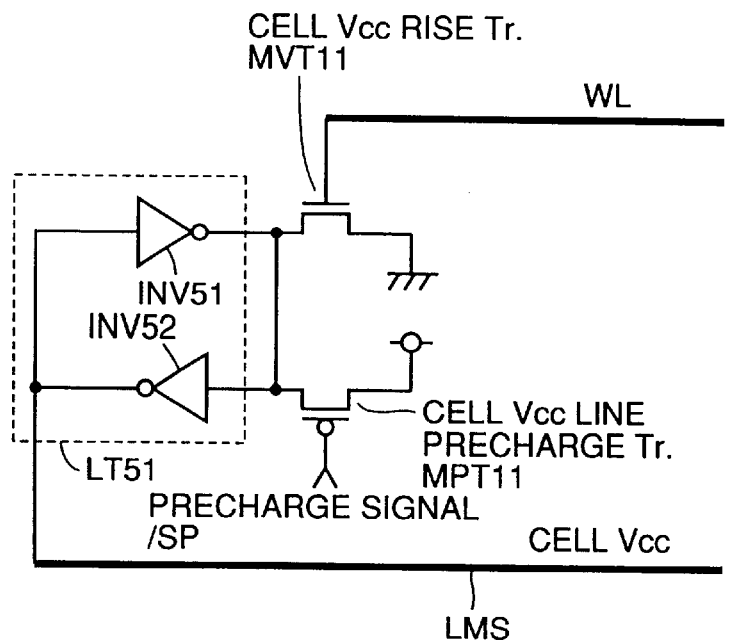

FIG. 28 is a circuit diagram to describe a structure of a row latch circuit 2004 provided for each row, which is a modification of row latch circuit 2000 of FIG. 26.

In contrast to the structure of FIG. 26, the gate potential of memory cell power supply line precharge transistor MPT11 of the P channel MOS transistor is controlled by signal /SP corresponding to precharge signal SP with its polarity inverted.

The remaining elements are similar to those of row latch circuit 2000 of FIG. 26, provided that the polarity of the potential is opposite. Therefore, description thereof will not be repeated.

[Modification 3 of Ninth Embodiment]

Figure 29:
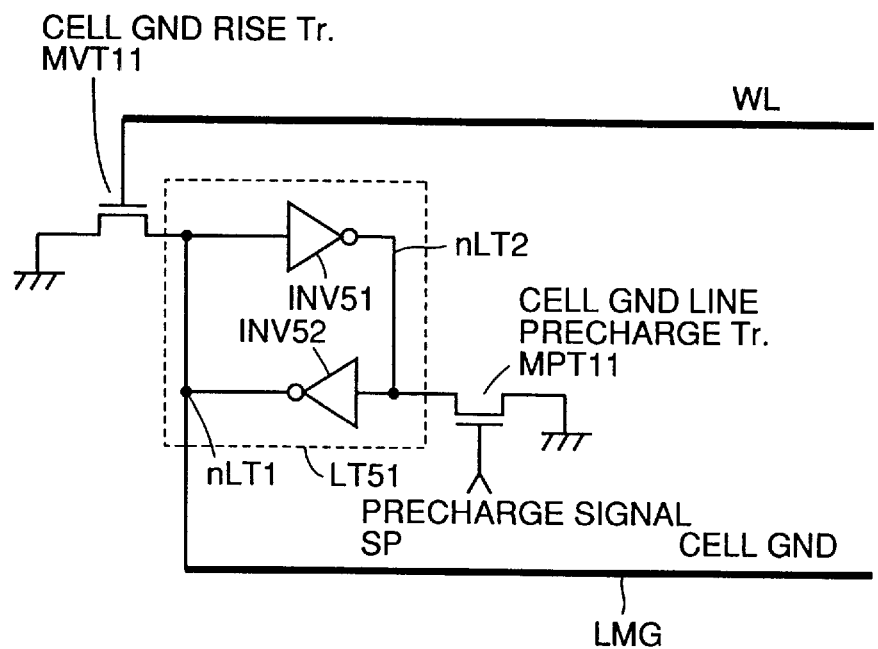

FIG. 29 is a circuit diagram to describe a structure of a row latch circuit 2006 provided for each row, which is a modification of row latch circuit 2002 of FIG. 27.

In contrast to the structure of FIG. 27, the gate potential of memory cell ground line precharge transistor MPT11 of the N channel MOS transistor is controlled by signal SP which corresponds to precharge signal /SP with the polarity inverted. Memory cell ground line precharge transistor MPT11 is provided between a node nLT2 of latch circuit LT51 and the ground potential. Memory cell ground line LMG is connected to node nLT1 of latch circuit LT51.

The remaining elements are similar to those of row latch circuit 2002 of FIG. 27, provided that the polarity of the potential is opposite. Therefore, description thereof will not be repeated.

Row latch circuits 2000–2006 of FIGS. 26–29, respectively, are applicable to column redundancy by taking the potential of the word line as a column select signal of H enable.

Tenth Embodiment

An SRAM according to a tenth embodiment of the present invention is directed to a structure in which the fuse element to specify an address for redundancy replacement is used in common as a fuse element to chive the memory cell power supply line to the ground level (or, as a fuse element to drive the memory cell ground line to the power supply level) in a structure where row redundancy replacement is allowed for every plurality of rows.

As will becomes apparent from the following description, in column redundancy employing a column select signal of H enable in a structure where a column redundancy replacement is allowed for every plurality of columns, the fuse element specifying an address for redundancy replacement can also be used as a fuse element to drive the memory cell power supply line to the ground level (or, the fuse element that drives the memory cell ground line to the power supply potential).

Differing from the above-described first to eighth embodiments, the consumed current during standby can be suppressed while the fuse area is reduced by virtue of the structure of the fuse element specifying an address for redundancy replacement that switches the operation of the memory cell power supply using the structure of the well-known memory cell replacement redundancy fuse.

The structure of the memory cell array, the row decoder and the column decoder of the tenth embodiment is similar to that of the SRAM of the ninth embodiment shown in FIG. 25, provided that redundancy replacement is carried out in units of replacement of a plurality of rows at one time.

The memory cell power supply line or memory cell ground line is provided for every redundant unit of a plurality of rows at one time.

Figure 30:
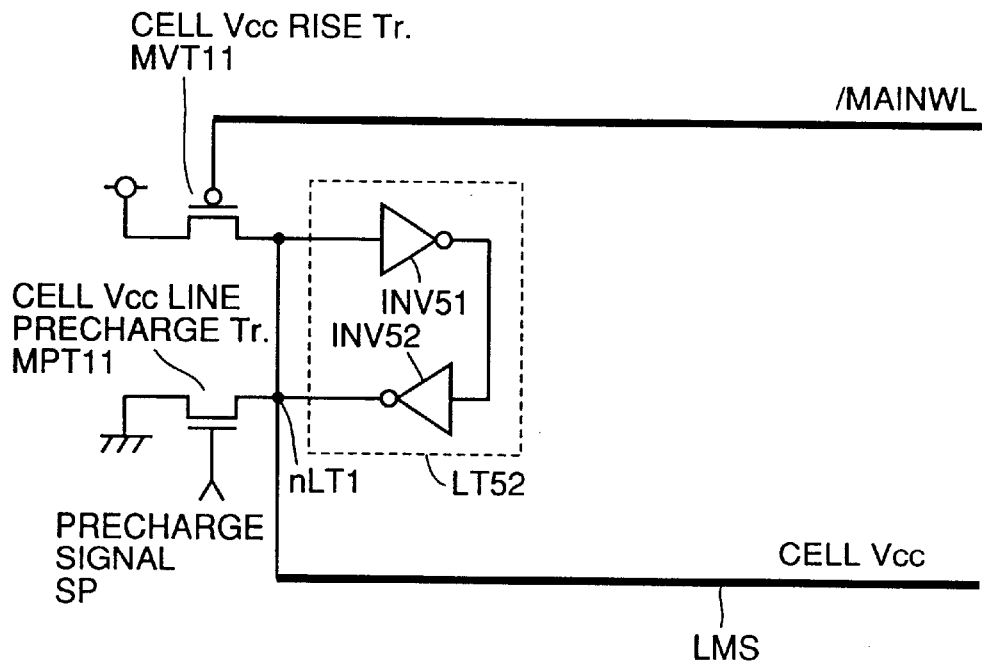

FIG. 30 is a circuit diagram to describe a structure of a row latch circuit 2100 provided for every redundancy replacement unit of a plurality of rows at one time, included in the circuitry shown in level retain circuit RLAT11 of FIG. 25.

Immediately after the power is turned on, and under control of control circuit 104, a precharge signal SP of an H level is applied to the gate of memory cell power supply line precharge transistor MPT11 which is an N channel MOS transistor so that all the memory cell power supply lines in the memory cell array attain the ground potential. The ground level is written into node nTL1 of latch circuit LT52 formed of inverters INV51 and INV52.

By applying signal SP of an L level to the gate of memory cell power supply line precharge transistor MPT11, latch circuit LT52 attains the retain state.

When the memory cell is first accessed (generally, write operation) after the power is turned on, signal /MAINWL to drive main word line MWL is pulled down to a level of L, whereby transistor MVT11 is rendered conductive. Power supply potential Vcc is written into node nLT1 of latch circuit LT52. Memory cell power supply line LMS coupled to node nLT1 is set to the power supply level (Vcc level).

Since the redundancy replacement unit of rows at one time subjected to redundancy replacement will not be accessed due to a defect in the memory cell, memory cell power supply line LMS corresponding to the redundancy replacement unit of rows including the defective memory cell is still precharged at the ground level.

Accordingly, the fuse element provided in a redundancy determination circuit 109c to specify a redundancy replacement address causes only the memory cell power supply line having an unprogrammed address to attain the level of power supply potential Vcc. The memory cell power supply line corresponding to the redundancy replacement unit of rows at one time that is subjected to redundancy replacement due to a defect and not used attains the ground level.

Even if the device attains a standby state, the data in latch circuit LT52 is retained, and the memory cell power supply line corresponding to the memory cell row that is subjected to redundancy replacement is at the ground level. Therefore, no standby current flows.

During the rise of the power, control circuit 104 will not apply a signal SP of an H level to the gate of memory cell power supply line precharge transistor MPT11. Therefore, the memory cell power supply line of the used row is still at the level of the power supply potential.

By employing a circuit 2100 as shown in FIG. 30, it is no longer necessary to provide a new fuse that occupies the layout area in order to drive the memory cell power supply line to the ground level, in addition to the conventional fuse for memory cell redundancy replacement.

[Modification 1 of Tenth Embodiment]

Figure 31:
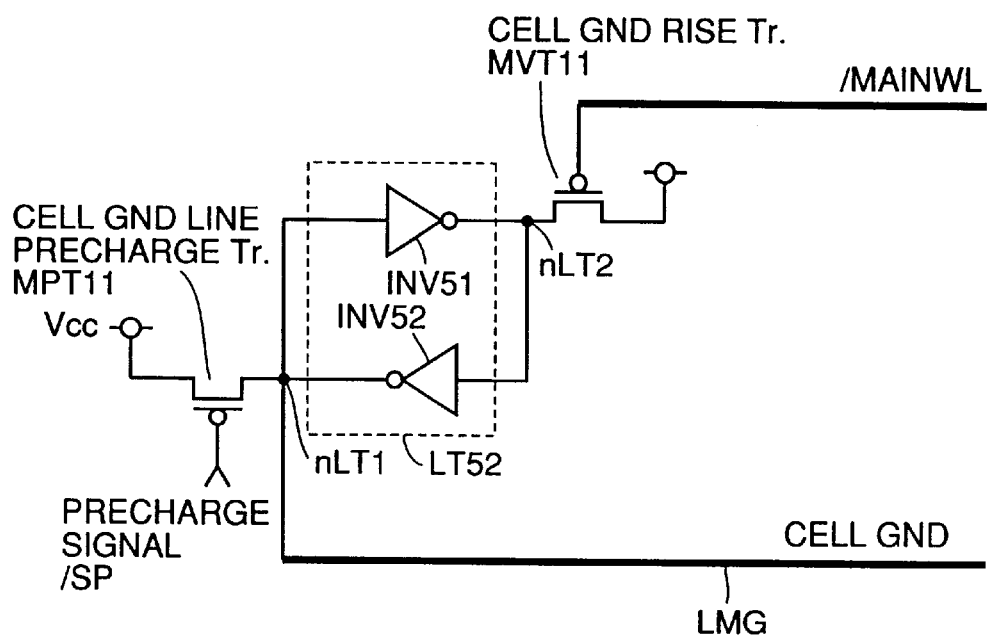

FIG. 31 is a circuit diagram to describe a structure of a row latch circuit 2102 provided for every redundancy replacement unit of a plurality of rows at one time, which is a modification of row latch circuit 2100 of FIG. 30.

In contrast to the structure of FIG. 30, the gate potential of memory cell ground line precharge transistor MPT11 of the P channel MOS transistor is controlled by a signal /SP corresponding to precharge signal SP with the polarity inverted. A memory cell ground line LMG is connected to node nLT1 of latch circuit LT52.

The remaining elements are similar to those of row latch circuit 2100 of FIG. 30, provided that the polarity of the potential is opposite. Therefore, description thereof will not be repeated.

[Modification 2 of Tenth Embodiment]

Figure 32:
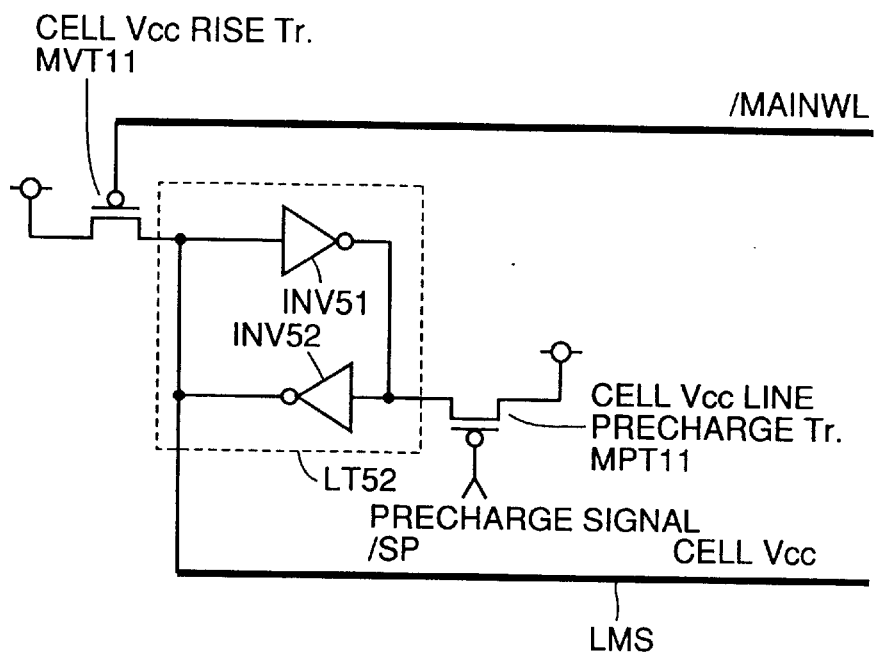

FIG. 32 is a circuit diagram to describe a structure of a row latch circuit 2104 provided for every redundancy replacement unit of a plurality of rows at one time, which is a modification of row latch circuit 2100 of FIG. 30.

In contrast to the structure of FIG. 30, the gate potential of memory cell power supply line precharge transistor MPT11 of the P channel MOS transistor is controlled by a signal /SP corresponding to precharge signal SP with the polarity inverted.

The remaining elements are basically similar to those of row latch circuit 2100 of FIG. 30, provided that the polarity of the potential is opposite. Therefore, description thereof will not be repeated.

[Modification 3 of Tenth Embodiment]

Figure 33:
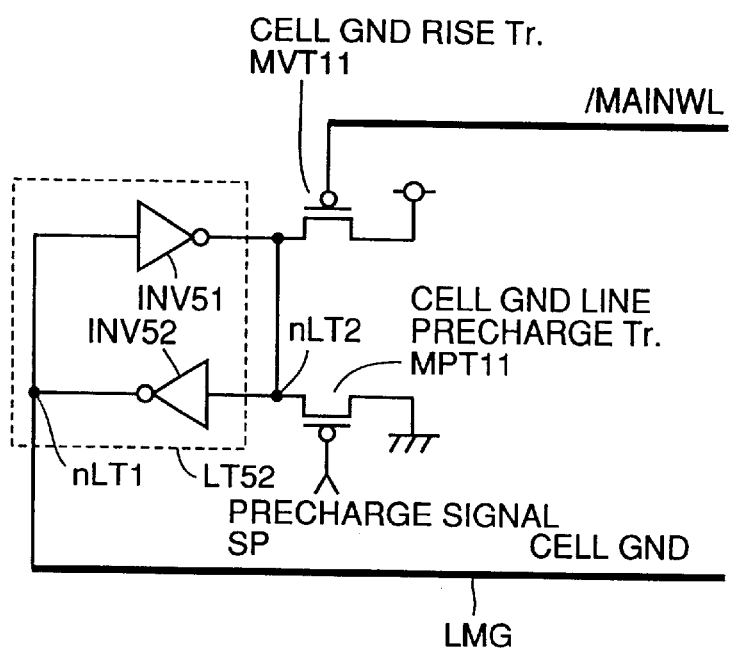

FIG. 33 is a circuit diagram to describe a structure of a row latch circuit 2102 provided for every redundancy replacement unit of rows at one time, which is a modification of row latch circuit 2102 of FIG. 31.

In contrast to the structure of FIG. 31, the gate potential of memory cell ground line precharge transistor MPT11 of the N channel MOS transistor is controlled by signal SP corresponding to precharge signal /SP with the polarity inverted. Memory cell ground line precharge transistor MPT11 is provided between node nLT2 of latch circuit LT51 and the ground potential. Memory cell power supply line LMG is connected to node nLT1 of latch circuit LT51.

The remaining elements are basically similar to those of row latch circuit 2102 of FIG. 31, provided that the polarity of the potential is opposite. Therefore, description thereof will not be repeated.

Row latch circuits 2100–2106 of FIGS. 30–33 are also applicable to column redundancy by taking the potential of the word line as the column select signal of an H enable.

Eleventh Embodiment

An SRAM according to an eleventh embodiment of the present invention is directed to a structure in which a fuse element that specifies an address for redundancy replacement is used in common as the fuse element to drive the memory cell power supply line to the ground level (or, a fuse element that drives the memory cell ground line to the power supply level).

As will become clear from the following description, in column redundancy employing a column select signal of H enable in a structure where column redundancy replacement for every one column is allowed, the fuse element that specifies an address for redundancy replacement can be also used as the fuse element that drives the memory cell power supply line to the ground level (or as the fuse element that drives the memory cell ground line to the power supply level).

Figure 34:
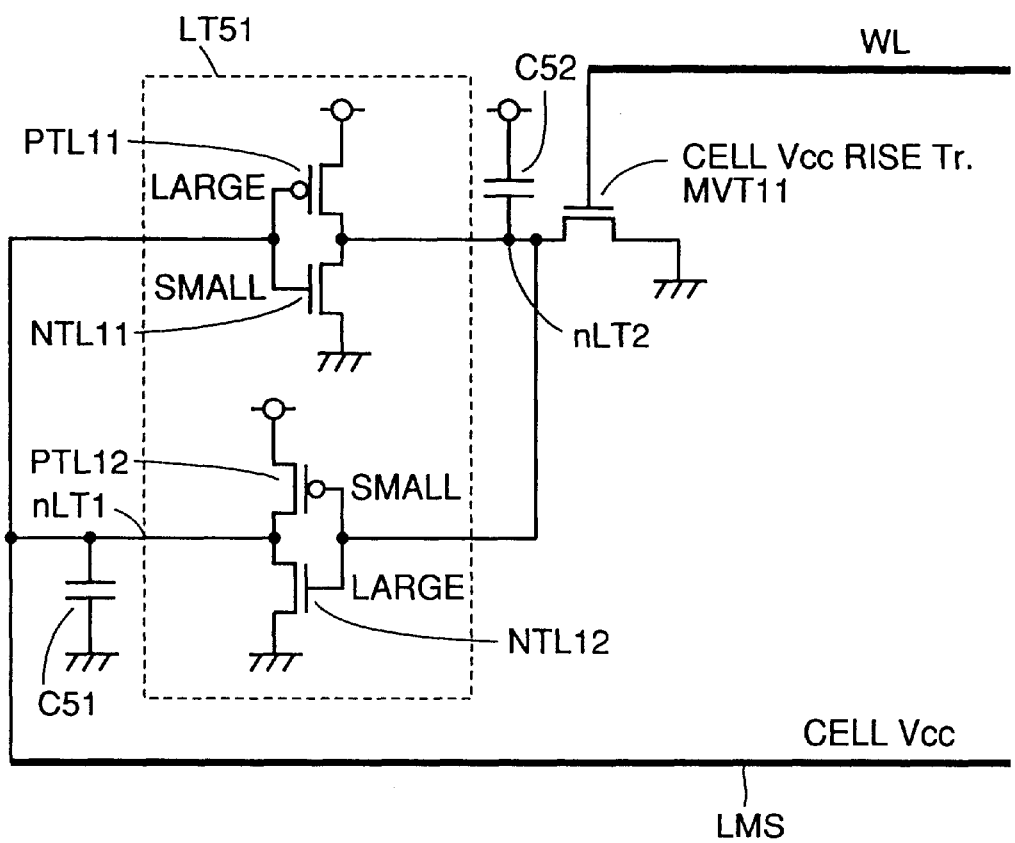
FIGS. 34 and 35 are circuit diagrams to describe a structure of row latch circuits 2001 and 2003, respectively, according to an eleventh embodiment of the present invention.

FIG. 34 is a circuit diagram to describe a structure of a row latch circuit 2001 according to an eleventh embodiment of the present invention, corresponding to FIG. 26 of the ninth embodiment.

In row latch circuit 2001, the size of P channel MOS transistor PTL11 is set larger than the size of N channel MOS transistor NTL11 in inverter INV51 forming latch circuit LT51. In inverter INV52, the size of P channel MOS transistor PTL12 is set smaller than the size of N channel MOS transistor NTL12.

The sizes of the transistors forming inverters INV51 and INV52 are set unbalanced to adjust the logic threshold value. Furthermore, a capacitor C51 is provided between a node nLT1 of latch circuit 51 and the ground potential. A capacitor C52 is provided between a node nLT2 of latch circuit 51 and the power supply potential. By such a structure, the data stored in the latch during rise of the power can be set to the ground potential without using precharge transistor MPT11.

Accordingly, the layout area of row latch circuit 2001 and the circuit area of control circuit 1004 can be reduced.

[Modification 1 of Eleventh Embodiment]

Figure 35:
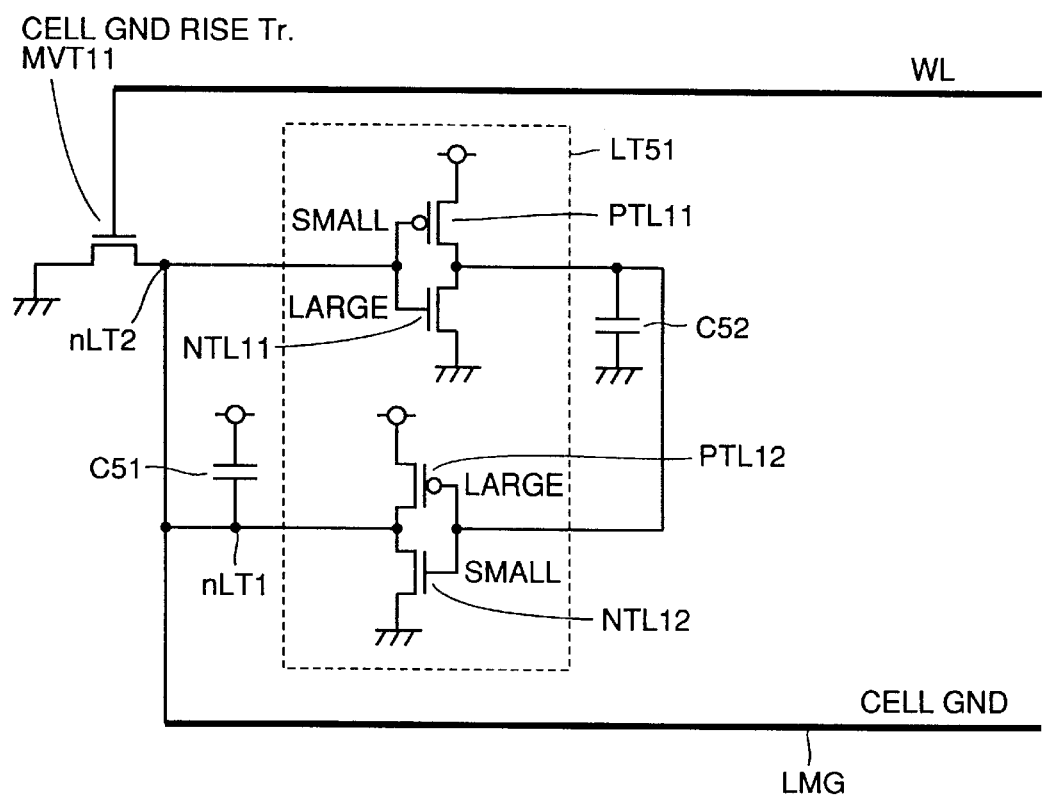

FIG. 35 is a circuit diagram to describe the structure of row latch circuit 2003 of the eleventh embodiment, corresponding to FIG. 27 of the ninth embodiment.

In row latch circuit 2003, the size of P channel MOS transistor PTL11 is set smaller than the size of N channel MOS transistor NTL11 in inverter INV51 forming latch circuit LT51. In inverter INV52, the size of P channel MOS transistor PTL12 is set larger than the size of N channel MOS transistor NTL12.

By setting the sizes of the transistors forming inverters INV51 and INV52 unbalanced, the logic threshold value is adjusted. Furthermore, a capacitor C51 is provided between node nLT1 of latch circuit LT51 and the power supply potential. A capacitor C52 is provided between the output node of inverter INV51 and the ground potential. By virtue of this structure, the data stored in the latch during the rise of the power can be set to the power supply potential level without using precharge transistor MPT11.

Accordingly, the layout area of row latch circuit 2003 and the circuit area of control circuit 104 can be reduced.

A structure in which a power on reset circuit is applied to the power supply system can be employed in order to prevent the latched data from being determined in an unintended direction due to the smaller influence of the capacitor component when the power is raised slowly.

Twelfth Embodiment

An SRAM according to a twelfth embodiment of the present invention is directed to a structure in which the fuse element to specify an address for redundancy replacement is used as a fuse element that drives the memory cell power supply line to the ground level (or a fuse element that drives the memory cell ground line to the power supply level) in the structure where row redundancy replacement for every plurality of rows is allowed.

As will become apparent from the following description, in column redundancy using a column select signal of H enable in a structure where column redundancy replacement for every plurality of columns is allowed, the fuse element to specify an address for redundancy replacement can also be used as the fuse element to drive the memory cell power supply line to the ground level (or, as the fuse element that drives the memory cell ground line to the power supply level).

Figure 36:
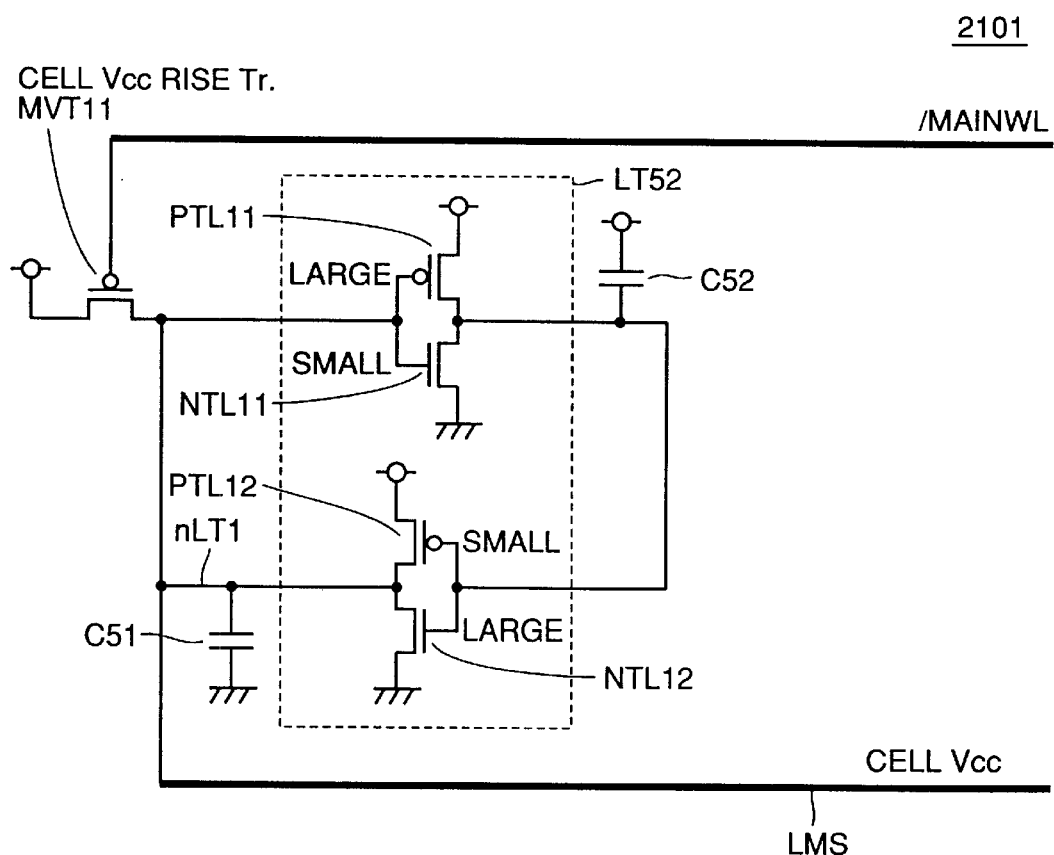
FIGS. 36 and 37 are circuit diagrams to describe a structure of row latch circuits 2101 and 2103, respectively, according to a twelfth embodiment of the present invention.

FIG. 36 is a circuit diagram to describe the structure of row latch circuit 2101 of the twelfth embodiment, corresponding to FIG. 30 of the tenth embodiment.

In row latch circuit 2101, P channel MOS transistor PTL11 is set larger than the size of N channel MOS transistor NTL11 in inverter INV51 forming latch circuit LT52. In inverter INV52, the size of P channel MOS transistor PTL12 is set larger than the size of N channel MOS transistor NTL12.

Thus, the logic threshold value is adjusted by setting the size of the transistors forming inverters INV51 and INV52 unbalanced. Also, a capacitor C51 is provided between node nLT1 of latch circuit LT52 and the ground potential. A capacitor C52 is provided between the output node of inverter INV51 and the power supply potential. By this structure, the data stored in the latch during rise of the power supply can be set to the ground potential without using precharge transistor MPT11.

Accordingly, the layout area of row latch circuit 2101 and the circuit area of control circuit 104 can be reduced.

[Modification 1 of Twelfth Embodiment]

Figure 37:
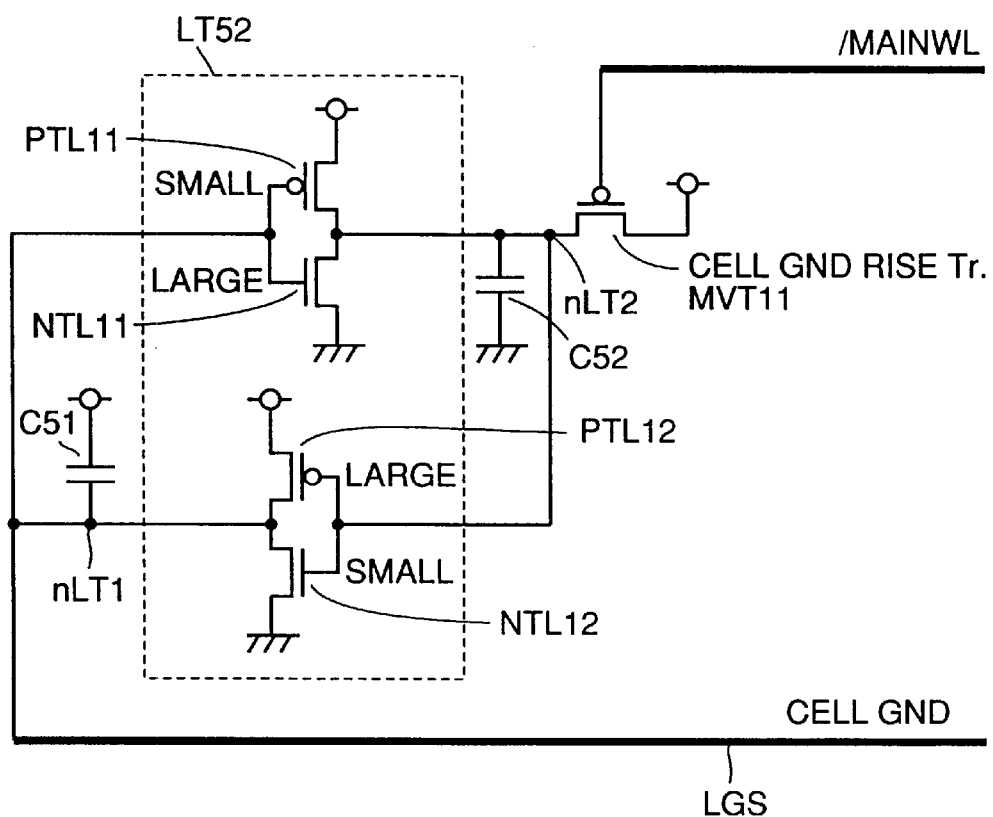

FIG. 37 is a circuit diagram to describe the structure of row latch circuit 2103 of the twelfth embodiment, corresponding to FIG. 31 of the tenth embodiment.

In row latch circuit 2103, the size of P channel MOS transistor PTL11 is set smaller than the size of N channel MOS transistor NTL11 in inverter INV51. In inverter INV52, the size of P channel MOS transistor PTL12 is set larger than the size of N channel MOS transistor NTL12.

The size of the transistors forming inverters INV51 and INV52 are set unbalanced to adjust the logic threshold value. Also, a capacitor C51 is provided between node nLT1 of latch circuit LT51 and the power supply potential. A capacitor C52 is provided between node nLT2 and the ground potential. By such a structure, the data stored in the latch during the rise of the power can be set to the power supply potential level without having to use precharge transistor MPT11.

Accordingly, the layout area of row latch circuit 2103 and the circuit area of control circuit 104 can be reduced.

A structure can be employed in which a power on reset circuit is applied to the power supply system in order to prevent the latched data from being determined in an unintended direction due to the reduced effect of the capacitor component when the power supply is raised slowly.

Thirteenth Embodiment

A SRAM according to a thirteenth embodiment of the present invention is directed to the structure of pulling up the required memory cell power supply by scanning all memory cell rows (or columns) forming the regular memory cell array and selecting.

In the previous ninth to twelfth embodiments, activation of the memory cell power supply line from the ground level to the power supply potential level or activation of the memory cell ground line from the power supply potential level to the ground potential level is time consuming at the first access after the power is turned on, inducing the possibility of a longer time for access.

Particularly, when the memory cell power supply line or the memory cell ground line is supplied with the potential of the well of the memory cell, the time for rising becomes longer.

Figure 38:
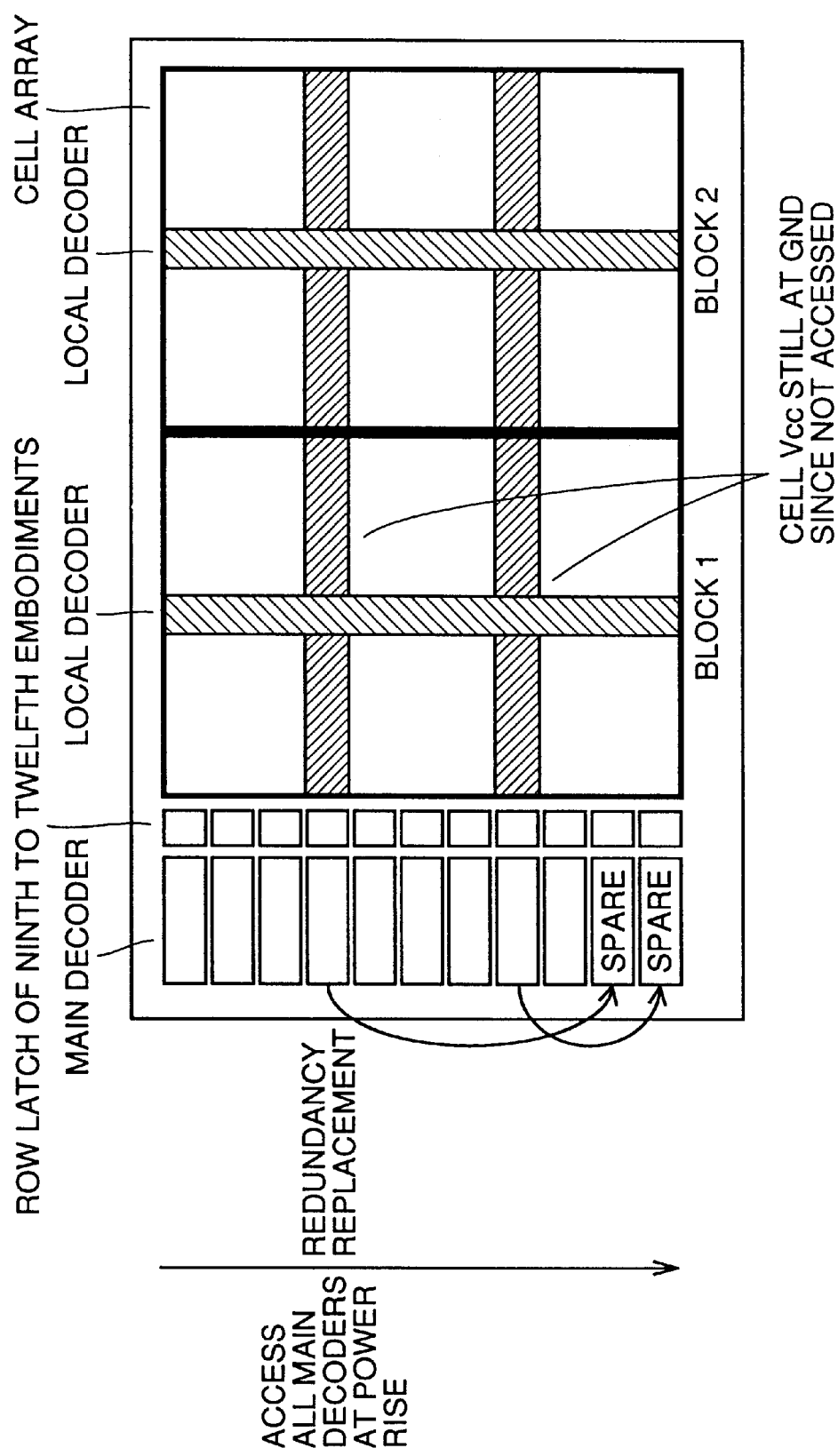
FIG. 38 is a schematic block diagram showing a structure of a memory cell array according to a thirteenth embodiment of the present invention.

FIG. 38 is a schematic block diagram showing a structure of a memory cell array according to a thirteenth embodiment of the present invention.

In a structure similar to that of the ninth to twelfth embodiments, all the rows (or all the columns) are scanned and selected immediately after the rise of the power supply under control of control circuit 104 to render the required memory cell power supply line or memory cell ground line active prior to external access, as shown in FIG. 38. Even if scanning is carried out as described above, the power supply line of the row that is subjected to redundancy replacement and not used is still at the ground level as in the ninth to twelfth embodiments since it is not accessed. Therefore, no standby current will flow even in a standby state.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A static type semiconductor memory device comprising:

a regular memory cell array in which a plurality of memory cells are arranged in a matrix, each memory cell capable of retaining a first level and a second level, said regular memory cell array being divided in a plurality of memory cell replacement units;

a redundant memory cell array for redundancy repair for one of said memory cell replacement units in said regular memory cell array;

a power supply node to which a first potential corresponding to said first level is supplied;

a plurality of first lines, provided corresponding to said memory cell replacement units respectively, each for supplying said first potential from said power supply node to said memory cells in a corresponding said memory cell replacement unit; and a potential supply control circuit that can selectively cease supply of said first potential from said power supply node to one of said plurality of first lines;

wherein said power supply control circuit comprises a potential modify circuit that can modify the potential supplied to said plurality of first lines to a second potential corresponding to said second level from said first potential independently and in a nonvolatile manner.

2. The static type semiconductor memory device according to claim 1, wherein said redundant memory cell array is divided into redundancy replacement units, each including memory cells identical in number to said memory cell replacement unit, wherein said potential modify circuit comprises a plurality of nonvolatile storage circuits provided corresponding to said memory cell replacement units, respectively, to set redundancy replacement of a corresponding said memory cell replacement unit, and a plurality of potential set circuits provided corresponding to said nonvolatile storage circuits, respectively, to modify the potential supplied to a corresponding first line out of said plurality of first lines to said second potential from said first potential according to stored information of said nonvolatile storage circuit, said static type semiconductor memory device further comprising a redundancy select circuit selecting said redundancy replacement unit instead of said memory cell replacement unit that is to be subjected to redundancy replacement according to stored information in said nonvolatile storage circuit when said memory cell replacement unit to be subjected to redundancy replacement is selected according to an external address signal.

3. The static type semiconductor memory device according to claim 2, wherein each of said nonvolatile storage circuits includes a fuse element that can be decoupled to set redundancy replacement of said corresponding memory cell replacement unit, wherein each of said potential set circuit modifies the potential supplied to said first line according to whether said fuse element included in a corresponding nonvolatile storage circuit out of said plurality of nonvolatile storage circuits is decoupled or not.

4. The static type semiconductor memory device according to claim 1, wherein said first potential is lower than said second potential, and each said memory cell redundancy unit includes a memory cell row.

5. The static type semiconductor memory device according to claim 1, wherein said first potential is lower than said second potential, and each said memory cell replacement unit includes a memory cell column.

6. The static type semiconductor memory device according to claim 1, wherein each said memory cell replacement unit includes a plurality of memory cell rows.

7. The static type semiconductor memory device according to claim 1, wherein each said memory cell replacement unit includes a plurality of memory cell columns.

8. The static type semiconductor memory device according to claim 5, further comprising:

a plurality of bit line pairs provided corresponding to a column of said memory cell array, and a plurality of bit line load circuits provided corresponding to said each bit line pair, wherein the potential supplied to said bit line load circuit corresponding to said memory cell replacement unit that is to be replaced is set to an inactive potential in response to the potential supplied to said corresponding first line modified to said second potential from said first potential by said potential set circuit according to stored information in said nonvolatile storage circuit.

9. A static type semiconductor memory device comprising:

a regular memory cell array in which a plurality of memory cells are arranged in a matrix, each memory cell capable of retaining a first level and a second level, said regular memory cell array being divided into a plurality of memory cell replacement units;

a redundant memory cell array to perform redundancy repair for one of said memory cell replacement units in said regular memory cell array;

a power supply node to which a first potential corresponding to said first level is supplied;

a plurality of first lines provided corresponding to said memory cell replacement units respectively, each for supplying said first potential from said power supply node to said memory cells in a corresponding one of said memory cell replacement units in a normal operation;

and a plurality of potential retain circuits provided corresponding to said plurality of first lines, respectively, each for precharging a corresponding one of said first lines to a second potential corresponding to said second level after initiation of power supply to said static type semiconductor memory device, and supplying said first potential to said corresponding one of first lines in response to said corresponding memory cell replacement unit being accessed.

10. The static type semiconductor memory device according to claim 9, further comprising:

a nonvolatile storage circuit to store in a nonvolatile manner an address corresponding to a memory cell replacement unit that is to be replaced by said redundant memory cell replacement unit out of said regular memory cell array, and a circuit accessing said redundant memory cell array instead of said memory cell replacement unit to be replaced when selection of said memory cell replacement unit to be replaced is specified according to an address signal.

11. The static type semiconductor memory device according to claim 9, wherein each said plurality of potential retain circuits comprises a latch circuit retaining said first potential or said second potential level according to external setting, a precharge circuit retaining said second potential in said latch circuit after initiation of power supply to said static type semiconductor memory device, and a potential convert circuit setting a potential level retained at said latch circuit to said first potential from said second potential according to said corresponding memory cell replacement unit being accessed, wherein the potential level retained by said latch circuit is applied to said corresponding first line.

12. The static type semiconductor memory device according to claim 11, further comprising a circuit that accesses said memory cell replacement unit while scanning after initiation of power supply to said static type semiconductor memory device.

13. The static type semiconductor memory device according to claim 9, wherein each of said plurality of potential retain circuits comprises a latch circuit retaining a level of said first potential or second potential according to external setting, wherein said latch circuit includes first and second inversion circuits having input nodes and output nodes connect to each other, wherein a logic threshold value of said first and second inversion circuits are set to have said second potential retained in said latch circuit after initiation of power supply to said static type semiconductor memory device, further comprising a potential convert circuit setting the potential level retained in said latch circuit to said first potential from said second potential according to said corresponding memory cell replacement unit being accessed, wherein the potential level retained by said latch circuit is applied to said corresponding first line.

14. The static type semiconductor memory device according to claim 13, further comprising a circuit that accesses said memory cell replacement unit while scanning after initiation of power supply to said static type semiconductor memory device.

\* \* \* \* \*